(12) United States Patent
Ooishi

(10) Patent No.: US 7,099,229 B2
(45) Date of Patent: *Aug. 29, 2006

(54) NONVOLATILE MEMORY DEVICE HAVING CIRCUIT FOR STABLY SUPPLYING DESIRED CURRENT DURING DATA WRITING

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/063,614

(22) Filed: Feb. 24, 2005

(65) Prior Publication Data
US 2005/0141270 A1 Jun. 30, 2005

Related U.S. Application Data

(63) Continuation of application No. 10/456,530, filed on Jun. 9, 2003, now Pat. No. 6,868,031.

(30) Foreign Application Priority Data

Dec. 4, 2002 (JP) .............................. 2002-352908

(51) Int. Cl.
*G11C 8/00* (2006.01)
(52) U.S. Cl. ........................... 365/230.03; 365/230.09; 365/158
(58) Field of Classification Search ...................... None
See application file for complete search history.

(56) References Cited

U.S. PATENT DOCUMENTS 6,256,224 B1 7/2001 Perner et al.
6,611,454 B1 8/2003 Hidaka
6,618,317 B1* 9/2003 Tsuji et al. ............ 365/230.07
6,714,440 B1* 3/2004 Subramanian et al. ...... 365/158
6,868,031 B1* 3/2005 Ooishi .................... 365/230.03

OTHER PUBLICATIONS

Roy Scheuerlein et al., "A 10ns Read and Write Non-Volatile Memory Array Using a Magnetic Tunnel Junction and FET Switch in Each Cell", IEEE ISSCC Digest of Technical Papers, TA7.2, Feb. 2000, pp. 94-95, 128-129, 409-410.
"Forefront of Non-Volatile Memory-The Future in Intel's Mind: From Flash Memory to OUM", Nikkel Microdevices, Mar. 2002, pp. 65-78 (w/Partial English Translation).
Takeshi Honda et al., "MRAM-Writing Circuitry to Compensate for Thermal-Variation of Magnetization-Reversal Current", 2002 Symposium on VLSI Circuits Digest of Technical Papers.

* cited by examiner

*Primary Examiner*—David Lam
(74) *Attorney, Agent, or Firm*—McDermott Will & Emery LLP

(57) ABSTRACT

A memory block is divided into block units for which parallel data write is performed. Current supply sections capable of supplying a power supply voltage and a ground voltage are provided for block units, independently of one another. With this configuration, in each block unit, writing of data to a selected memory cell is performed by a data write current from the independent current supply section connected to the power supply voltage and the ground voltage. That is, wiring lengths of power supply lines for supplying the power supply voltage and the ground voltage can be shortened. It is therefore possible to suppress a wiring resistance of the power supply line and to supply a desired data write current.

2 Claims, 17 Drawing Sheets

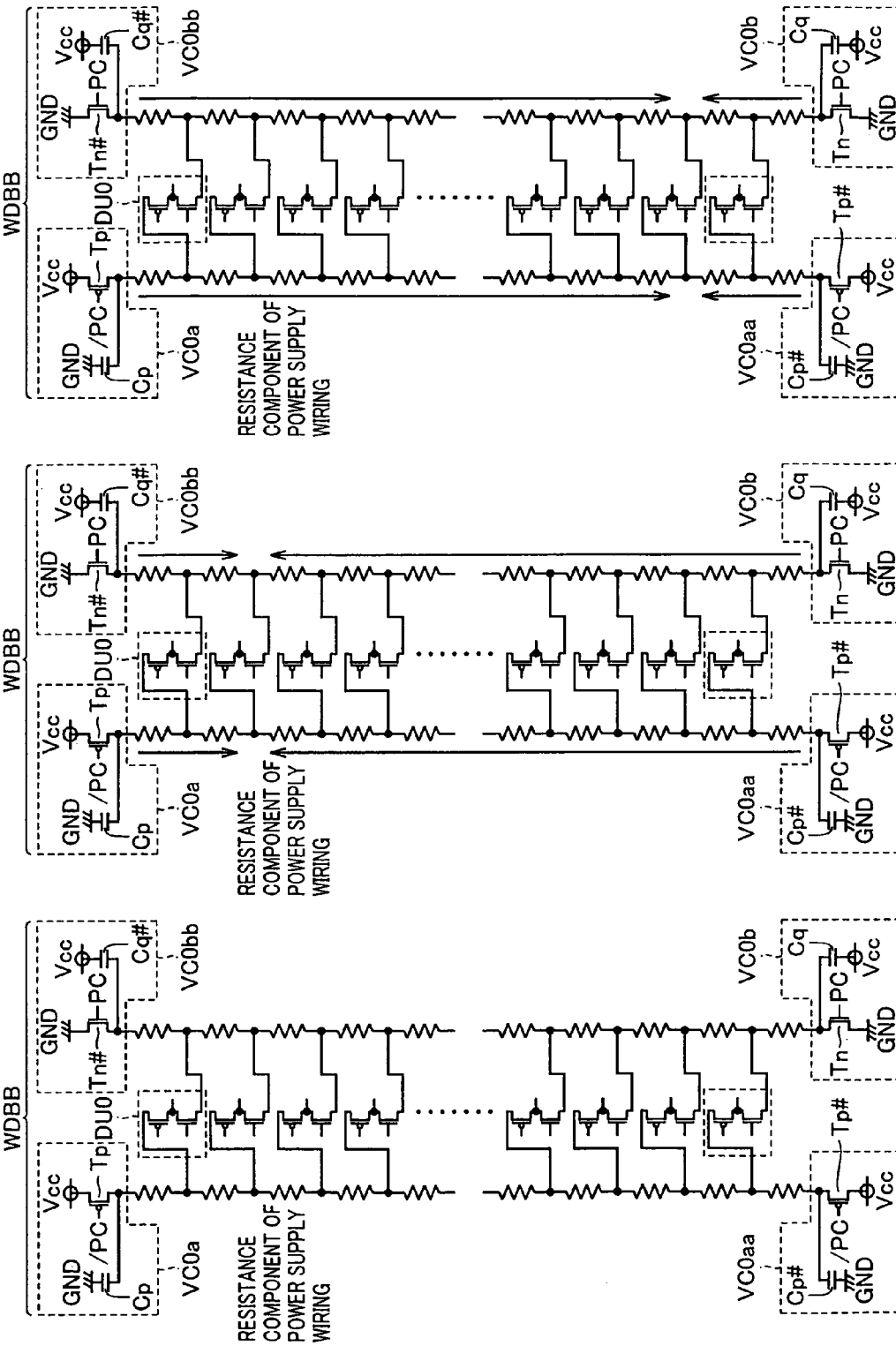

NONVOLATILE MEMORY DEVICE HAVING CIRCUIT FOR STABLY SUPPLYING DESIRED CURRENT DURING DATA WRITING

RELATED APPLICATION

This application is a continuation of application Ser. No. 10/456,530 filed Jun. 9, 2003 now U.S. Pat. No. 6,868,031.

BACKGROUND OF THE INVENTION

1. Field of the Invention

The present invention relates to a nonvolatile memory device, and more particularly to the configuration of a circuit which drives a current to be supplied when data is written.

2. Description of the Background Art

In recent years, nonvolatile memory devices capable of storing data in a nonvolatile manner have been mainly employed. An example thereof includes a flash memory which can be highly integrated. "A 10 ns Read and Write Non-Volatile Memory Array Using a Magnetic Tunnel Junction and FET Switch in each Cell", 2000 IEEE ISSCC Digest of Technical Papers, TA7.2 discloses an MRAM (Magnetic Random Access Memory) device which performs nonvolatile data storage using a thin film magnetic element as a nonvolatile memory device of new generation. In addition, "Forefront of Non-Volatile Memory/The Future in Intel's Mind: From Flash Memory to OUM," Nikkei Microdevices, March, 2002, discloses an OUM (R) (Ovonic Unified Memories) device which performs data storage using a material called a thin film calcogenide.

Generally, in the case where data storage for storing data in a memory cell employed as the memory element of one of these nonvolatile memory devices is performed, a predetermined voltage is applied to supply a current to the memory cell, thereby performing data write.

For example, in the case of an MRAM device, a predetermined data write current is generally supplied to a memory cell to thereby apply a magnetic field thereto in order to store data in accordance with a magnetic direction. Therefore, it is necessary to supply a desired data write current to a write target memory cell when data is written to the memory cell.

However, as the area of a memory array increases along with demand for mass capacity, the lengths of wirings such as a power supply wiring used for supplying the data write current and the like tend to be long.

Along with this, the resistances of the wirings such as the power supply wiring increase, with the result that a voltage level supplied from the power supply wiring often lowers by voltage drop based on the wiring resistances and the like.

As a result, the conventional technique has disadvantages in that the amount of the data write current is smaller than a desired amount and data write operation delays.

SUMMARY OF THE INVENTION

It is an object of the present invention to provide a nonvolatile memory device capable of realizing high speed data write operation by supplying a desired, stable data write current during data write.

A nonvolatile memory device according to the present invention includes a memory array and a plurality of current supply sections. The memory array includes a plurality of memory cells, each memory cell receiving supply of a data write current in accordance with storing data for performing data storage. The memory array is divided into a plurality of block units. A part of bits among a plurality of bits is written in parallel into respective the plurality of block units during a data writing. A plurality of current supply sections are provided in correspondence with the plurality of block units, respectively, and each supplies the data write current.

According to the present invention, a plurality of current supply sections is provided in correspondence with a plurality of block units, respectively. Therefore, it is possible to supply the data write current on the basis of the independent power supply voltage. Accordingly, it is possible to suppress the wiring resistances of power supply wirings, to supply the stable data write current, and to perform a highly accurate data write operation.

A further, this nonvolatile memory device includes a memory array, a write current line, a current supply circuit and a control circuit. The memory array includes a plurality of memory cells, each memory cell receiving supply of a data write current in accordance with storing data and performing data storage. The write current line supplies the data write current to the selected memory cell among the plurality of memory cells. The current supply circuit is provided in correspondence with the write current line, and activated during data writing to thereby supply the data write current to a current supply node. The control circuit carries a predetermined current from the current supply circuit to the current supply node before the data writing.

The control circuit which supplies a predetermined current to the current supply node before the data write is provided. It is thereby possible to supply the data write current immediately after the start of the data write, and to perform high speed data write.

Yet another, this nonvolatile memory device includes a memory array, a write current line, a current supply circuit, and a reference voltage generation circuit generating a reference voltage. The memory array includes a plurality of memory cells, each memory cell receiving supply of a data write current in accordance with storing data for performing data storage. The write current line supplies the data write current to the selected memory cell among the plurality of memory cells. The current supply circuit is provided in correspondence with the write current line, and activated during data writing to thereby supply the data write current. The current supply circuit includes a voltage adjustment circuit receiving input of a reference voltage, and adjusting a voltage level of the write current line electrically coupled to the current supply circuit to a voltage level of the reference voltage during the data writing. The reference voltage generation circuit includes a current path generation section and a predetermined-current supply section. The path generation section generates a current path similar to a current path of the data write current carried across the write current line. The predetermined-current supply section supplies a reference current to the current path generation section. In addition, the reference voltage is supplied from an output node provided between the predetermined-current supply section and the current path generation section.

The voltage adjustment circuit adjusting the voltage level of the write current line to that of the reference voltage, and the reference voltage generation circuit generating the reference voltage are provided. The reference voltage generation circuit includes a current path generation section generating a current path similar to the current path of the data write current. Since the reference voltage is generated by supplying the reference current to the current path generation section, it is possible to adjust the voltage level of the write current line by adjusting the reference current value, and to supply the desired data write current. Accordingly, it is possible to perform a highly accurate data write operation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 23A to 23C are block diagrams of a write driver band according to a fourth embodiment of the present invention.

DESCRIPTION OF THE PREFERRED EMBODIMENTS

Hereinafter, embodiments of the present invention will be described in detail with reference to the drawings. In the figures, the same or corresponding constituent elements are denoted by the same reference symbols, respectively, and they will not be repeatedly described.

First Embodiment

As will be obvious from the following description, the application of the present invention is not limited to an MRAM device including MTJ memory cells. The present invention is also applicable to a nonvolatile memory device including memory cells to which a pass-through current is carried during data write and data read.

Figure 1:
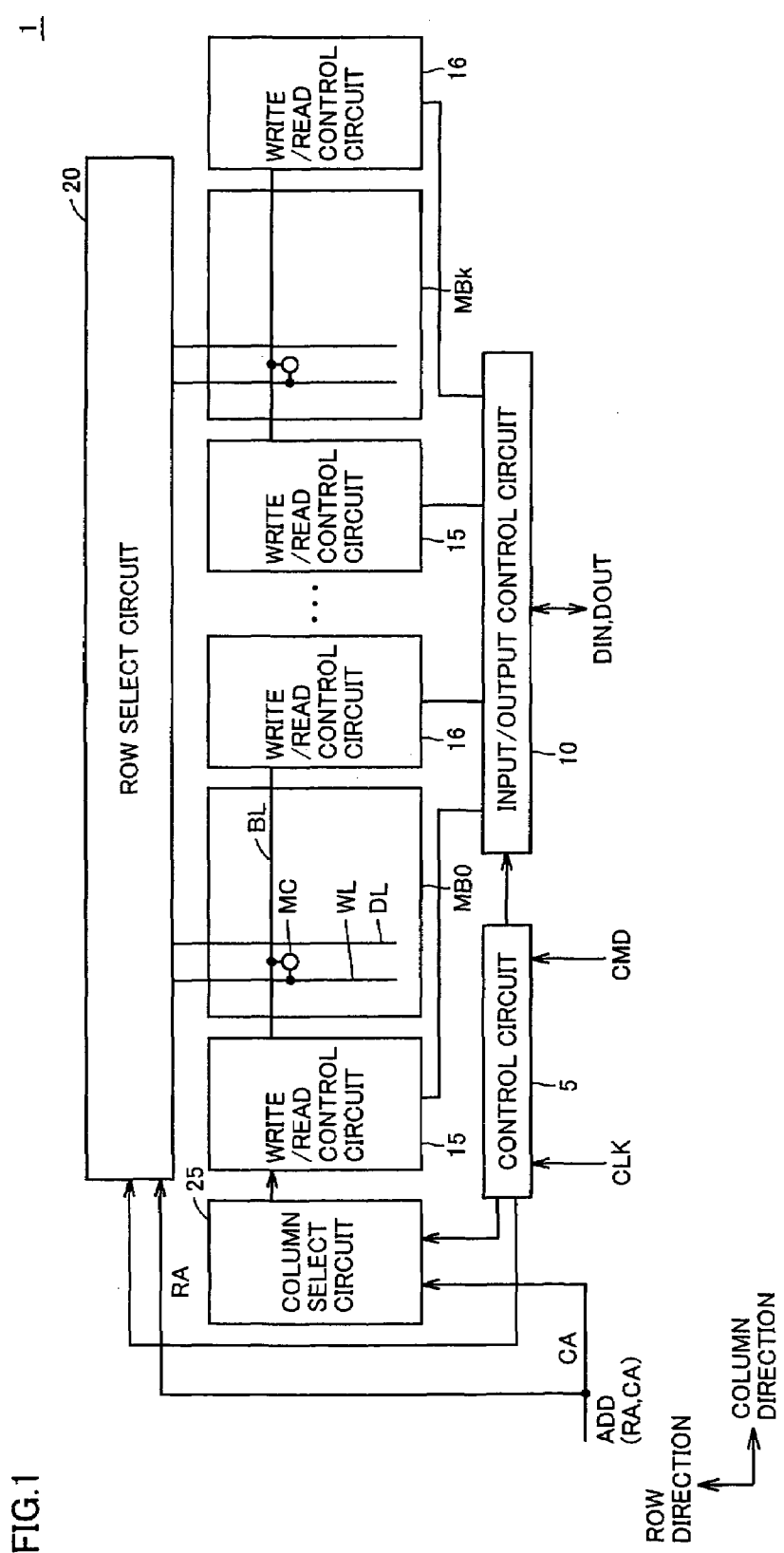
FIG. 1 is a schematic block diagram showing the entire configuration of an MRAM device which is shown as a typical example of a nonvolatile memory device according to a first embodiment of the present invention.

With reference to FIG. 1, an MRAM device 1, which is shown as a typical example of a nonvolatile memory device according to a first embodiment of the present invention, includes: a control circuit 5 which controls the entire operation of MRAM device 1 in response to a control signal CMD inputted synchronously with a clock signal CLK; and a plurality of memory blocks MB0 to MBk (where k is a natural number) each including MTJ memory cells MC arranged in a matrix. In the following description, memory blocks MB0 to MBk will be also, generically referred to as "memory blocks MB".

Herein, the row and column in a plurality of memory cells MC integrated and arranged in a matrix in each memory block MB will be also referred to as "memory row" and "memory column", respectively.

MRAM device 1 also includes a row select circuit 20, a column select circuit 25 and an input/output control circuit 10. Row select circuit 20 performs row selection in access target memory block MB on the basis of a row address RA included in an address signal ADD. Further, column select circuit 25 performs the column selection in access target memory block MB on the basis of a column address CA included in address signal ADD. Input/output control circuit 10 controls the input and output of data such as input data DIN and output data DOUT, and transmits the data to an internal circuit or outputs the data to the outside of MRAM device 1 in response to an instruction from control circuit 5. It is assumed herein that MRAM device 1 according to the first embodiment performs operation synchronous with clock signal CLK.

MRAM device 1 further includes write/read control circuits 15 and 16 which are provided on the both side of each memory block MB, and control the supply of a data write current and a data read current when data write and data read are performed. In the following, the binary high voltage state and low voltage state of a signal, a signal line and data will be also referred to as "H" level and "L" level, respectively.

Each memory block MB includes a plurality of word lines WL and digit lines DL provided in correspondence with the memory cell rows, respectively, and a plurality of bit lines BL provided in correspondence with the memory columns, respectively. In FIG. 1, one memory cell MC is typically shown, and one word line WL and one digit line DL are typically shown in correspondence with the memory cell row of memory cell MC. In addition, one bit line BL is typically shown in correspondence with the memory cell column of memory cell MC.

Since the other memory blocks are similar in configuration, they will not be repeatedly described.

Herein, the configuration of MTJ memory cell MC will be described.

Figure 2:
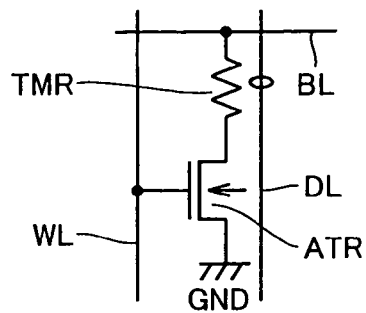
FIG. 2 is a schematic diagram showing the configuration of an MTJ memory cell including a magnetic tunnel junction.

With reference to FIG. 2, MTJ memory cell MC which includes a magnetic tunnel junction (hereinafter, also simply referred to as "memory cell MC") includes: a tunneling magneto-resistance element TMR having the electric resistance changing in accordance with the data level of stored data which is magnetically written; and an access transistor ATR. Access transistor ATR is connected in series to tunneling magneto-resistance element TMR between bit line BL and ground voltage GND. Typically, a field-effect transistor formed on a semiconductor substrate is applied as access transistor ATR.

Bit line BL and digit line DL for carrying data write currents in different directions during data write, and word line WL which is activated during data read are provided in correspondence with memory cell MC. During data read, when access transistor ATR is turned on, tunneling magneto-resistance element TMR is electrically coupled between ground voltage GND and bit line BL.

Next, the structure of MTJ memory cell MC and a data storage principle will be described.

Figure 3:
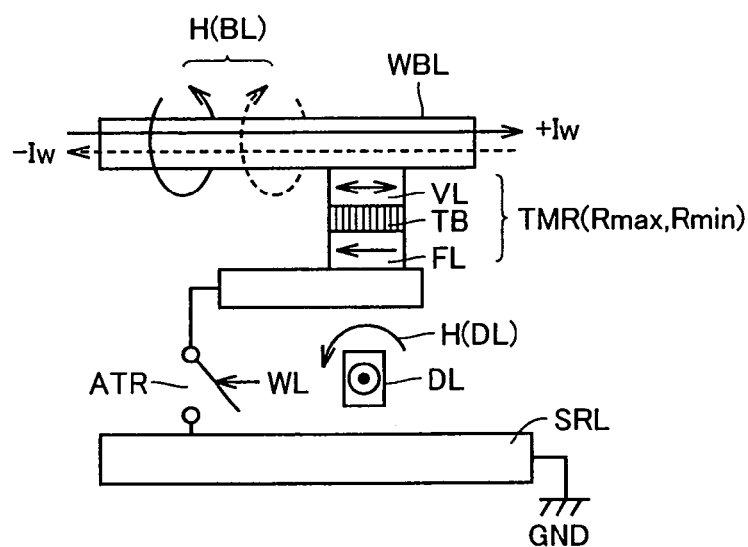
FIG. 3 is a conceptual diagram for describing the structure of the MTJ memory cell and a data storage principle.

With reference to FIG. 3, tunneling magneto-resistance element TMR includes: a ferromagnetic material layer (hereinafter, also simply referred to as "fixed magnetic layer") FL having a fixed, predetermined magnetic direction; and a ferromagnetic material layer (hereinafter, also simply referred to as "free magnetic layer") VL which can be magnetized in a direction in accordance with an externally applied magnetic field. A tunneling barrier (tunneling film) TB formed of an insulating film is provided between fixed magnetic layer FL and free magnetic layer VL. Free magnetic layer VL is magnetized in a direction equal or opposite to the direction of fixed magnetic layer FL in accordance with the level of the written memory data. Fixed magnetic layer FL, tunneling barrier TB and free magnetic layer VL form a magnetic tunnel junction.

The electric resistance of tunneling magneto-resistance element TMR changes in accordance with the relative relationship between the magnetic directions of fixed magnetic layer FL and free magnetic layer VL. Specifically, the electric resistance of tunneling magneto-resistance element TMR is a minimum Rmin in the case where the magnetic direction of fixed magnetic layer FL is equal (parallel) to that of free magnetic layer VL, and is a maximum Rmax in the case where they are opposite (non-parallel) to each other.

When data is written, word line WL is deactivated, and access transistor ATR is turned off. In this state, a data write current for magnetizing free magnetic layer VL is carried on bit line BL in a direction (±Iw) in accordance with the level of written data. A current is also carried to digit line. At this time, the magnetic direction of free magnetic layer VL is set on the basis of a magnetic field H(BL) generated by bit line BL and a magnetic field H(DL) generated by digit line DL.

Figure 4:
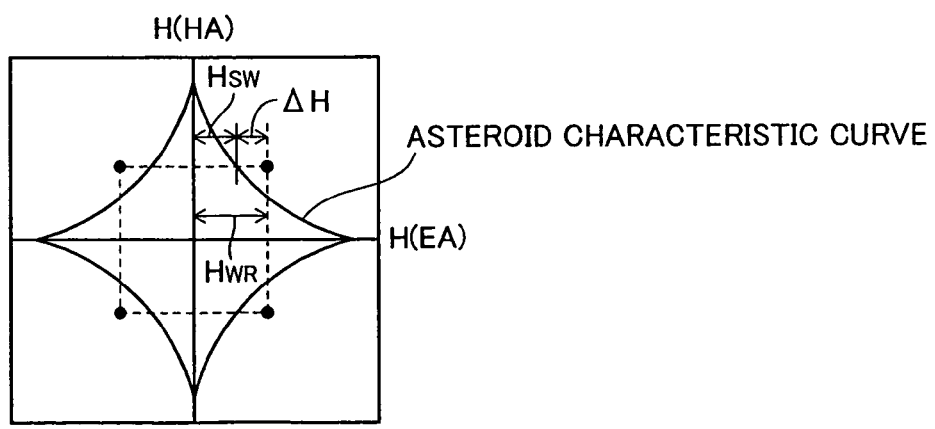
FIG. 4 is a conceptual diagram showing the relationship between the supply of a data write current to the MTJ memory cell and the magnetic direction of a tunneling magneto-resistance element.

With reference to FIG. 4, a relationship of a data write current to the MTJ memory cell and the magnetic direction of tunneling magneto resistance element will be described.

The horizontal axis H(EA) indicates the magnetic field applied to free magnetic layer VL within tunneling magneto-resistance element TMR in an easy axis (EA) direction. The vertical axis H(HA) indicates the magnetic field acting on a hard axis (HA) on free magnetic layer VL. Magnetic fields H(EA) and H(HA) correspond to two magnetic fields generated by currents carried to bit line BL and digit line DL, respectively.

In MTJ memory cell MC, the fixed magnetic direction of fixed magnetic layer FL is along the easy axis of free magnetic layer VL. Free magnetic layer VL is magnetized in a direction parallel or non-parallel (opposite) to that of fixed magnetic layer FL along the easy axis in accordance with the level of stored data. MTJ memory cell MC can store data of one bit in correspondence with the two magnetic directions of free magnetic layer VL.

The magnetic direction of free magnetic layer VL can be newly rewritten only in the case where the sum of magnetic fields H(EA) and H(HA) applied thereto reaches the outside region of an asteroid characteristic curve shown in FIG. 4. More specifically, in the case where the applied data write magnetic field has an intensity corresponding to the inside region of the asteroid characteristic curve, the magnetic direction of free magnetic layer VL does not change.

As indicated by the asteroid characteristic curve, in the case where a magnetic field in the hard axis direction is applied to free magnetic layer VL, it is possible to lower a magnetization threshold necessary to change the magnetic direction along the easy axis. As shown in FIG. 4, an operating point during data write is designed so as to be able to rewrite the data stored in MTJ memory cell MC, i.e., rewrite the magnetic direction of tunneling magneto-resistance element TMR when predetermined data write currents are applied to both digit line DL and bit line BL.

The operating point shown in FIG. 4 is designed so that the data write magnetic field in the easy axis direction has an intensity of $H_{WR}$ in data write target MTJ memory cell MC. That is, the data write current carried to bit line BL or digit line DL is designed so as to obtain data write magnetic field having intensity $H_{WR}$ (which data write magnetic field will be referred to as "magnetic field $H_{WR}$" hereinafter). Generally, data write magnetic field $H_{WR}$ is given by the sum of a switching magnetic field $H_{SW}$ necessary to switch the magnetic direction and a margin $\Delta H$. In short, data write magnetic field $H_{WR}$ is represented as $H_{WR}=H_{SW}+\Delta H$.

The magnetic direction, i.e., the storage data of MTJ memory cell MC which is once written to tunneling magneto-resistance element TMR is held in a nonvolatile manner before new data write is performed. Strictly speaking, the electric resistance of each memory cell is the sum of the resistance of tunneling magneto-resistance element TMR, the ON resistance of access transistor ATR, and the other parasitic resistances. The resistances other than that of tunneling magneto-resistance element TMR are constant regardless of the storage data. Therefore, two electric resistances of a normal memory cell according to the storage data will be also denoted by Rmax and Rmin, and the difference between Rmax and Rmin will be denoted by $\Delta R$ (i.e., $\Delta R=Rmax-Rmin$).

Figure 5:
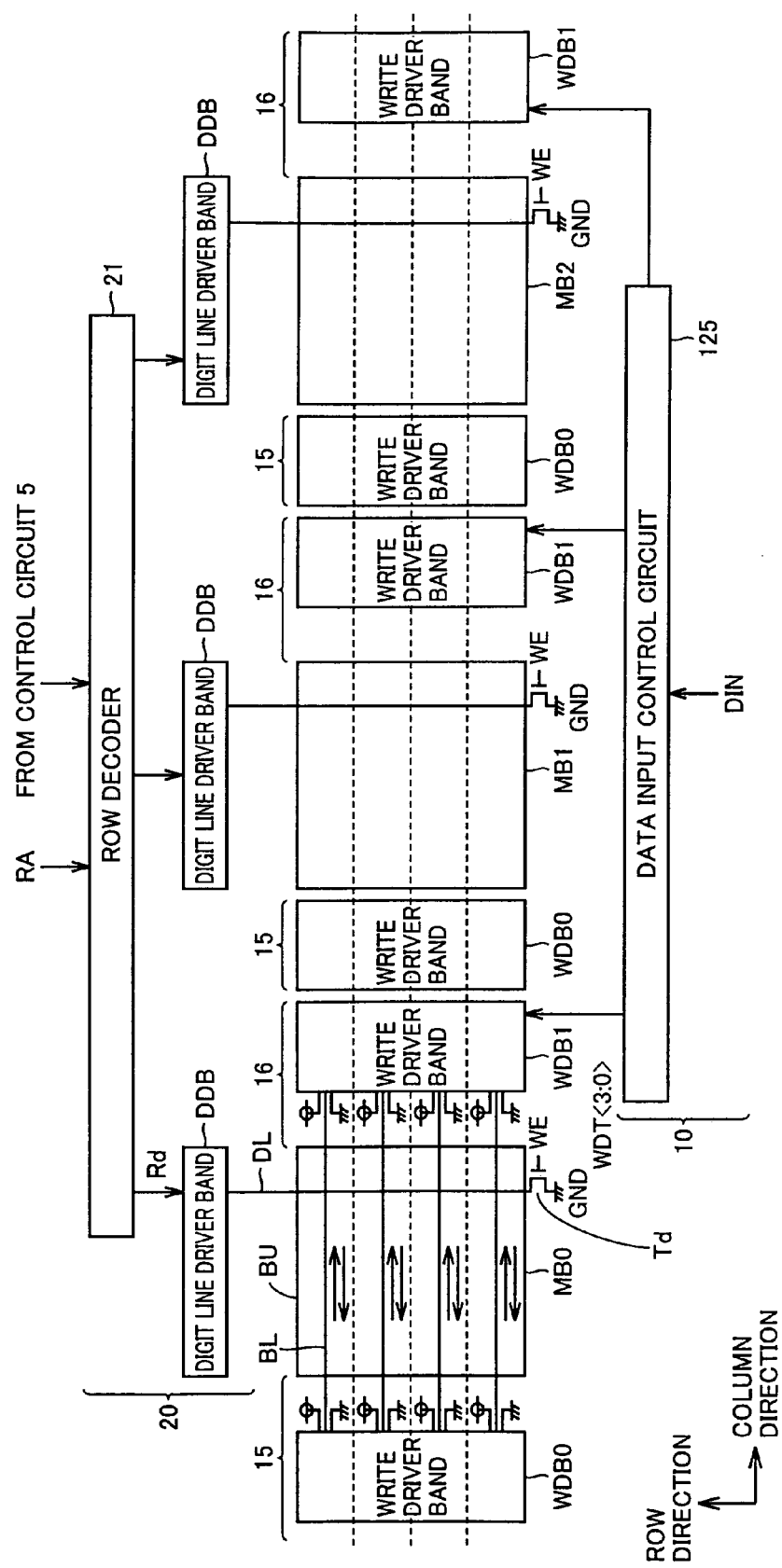
FIG. 5 is a conceptual diagram of a circuit band which supplies a data write current according to the first embodiment of the present invention.

With reference to FIG. 5, a circuit band which supplies data write currents according to the first embodiment (hereinafter, also referred to as "current driving circuit") includes: write/read control circuit 15 and 16 provided on the both sides of each memory block MB; a row select circuit 20; and an input/output control circuit 10. In this embodiment, memory blocks MB0 to MB2 and the peripheral circuits thereof are typically shown.

Write/read control circuits 15 and 16 include write driver band WDB0 and WDB1 for supplying data write currents are provided in correspondence with corresponding memory block MB, respectively. Row select circuit 20 includes: a row decoder 21 which performs row selection for memory block MB selected in response to row address RA and an instruction signal from control circuit 5; and a digit line driver band DDB which is provided for each memory block MB and supplies a data write current to digit line DL of select target memory block MB in response to a decode signal Rd employed for address selection supplied from row decoder 21. Further, digit line driver band DDB includes a plurality of digit line drivers which are provided in correspondence with digit line DL, respectively and which selectively supply the data write current in accordance with decode signal Rd from row decoder 21.

Input/output control circuit 10 receives an input from input data DIN to selectively transmit write data WDT<3:0> to the write driver band of write/read control circuit 16 provided in correspondence with each memory block MB. In the present specification, signals W<j:k> are simple reference to signals Wk to Wj. This applies hereinafter.

The current driving circuit according to the first embodiment further includes a transistor Td which is provided for each digit line DL and which pulls down digit line DL to ground voltage GND in the region opposite to row select circuit 20 across memory block MB. Transistor Td pulls down corresponding digit line DL to ground voltage GND in response to the input of a control signal WE which is activated during data write.

Herein, as indicated by dotted lines of FIG. 5, the current driving circuit according to the first embodiment divides memory block MB. Specifically, memory block MB is divided into block units in which data write is performed in parallel. In addition, the power supply voltage and the ground voltage supplied to the write driver band are separated according to the divided blocks.

In FIG. 5, a configuration in which memory block MB is divided into four block units in the case where data of 4 bits are written in parallel by way of example. In the following description, the respective blocks divided from memory block MB will be also referred to as "block units BU" in some cases.

Figure 6:
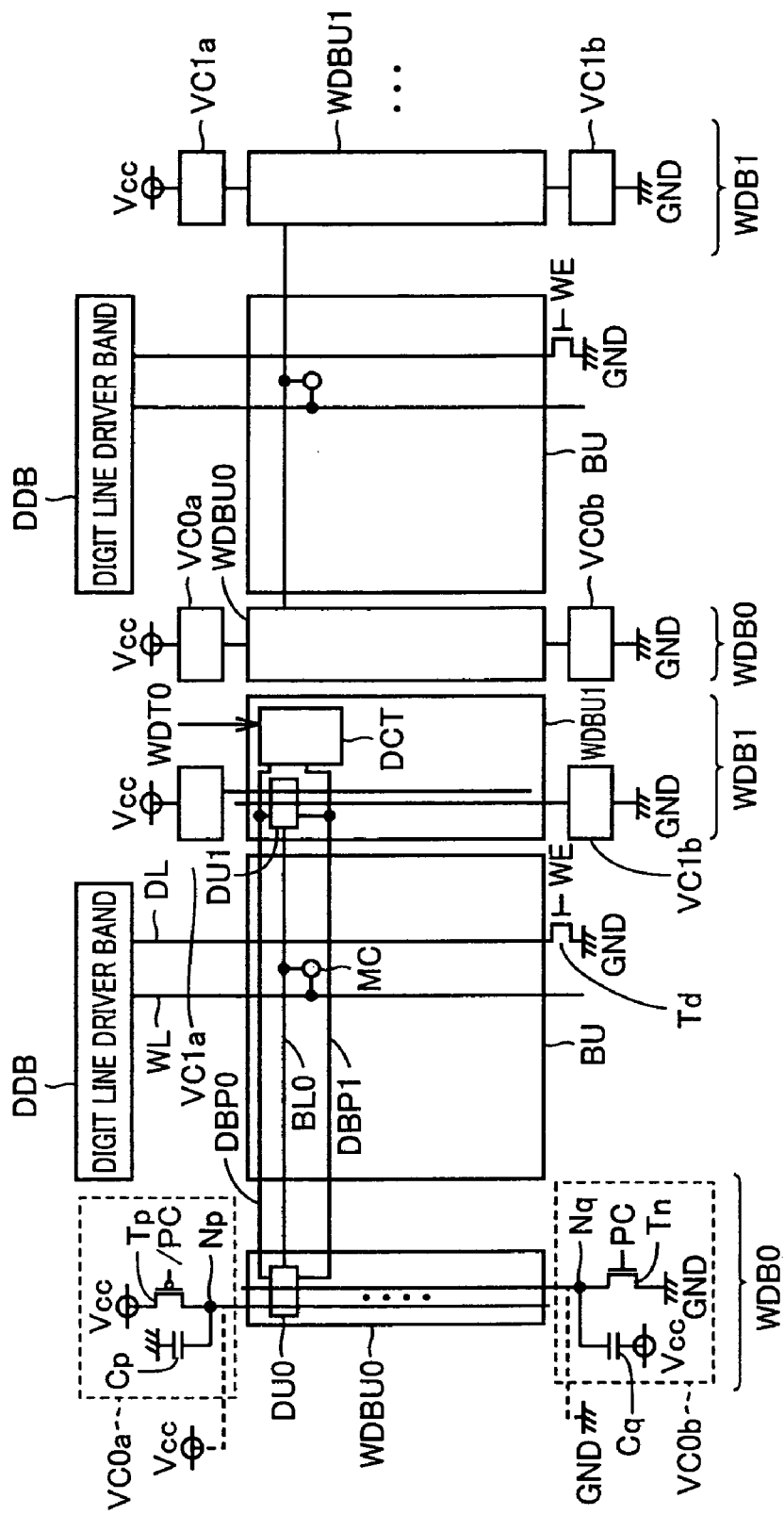
FIG. 6 shows the configuration of divided block units and a write driver band provided in a peripheral region.

With reference to FIG. 6, as for each of block units BU divided from memory block MB, write driver band WDB0 provided on the each side of block unit BU includes: a write driver unit WDBU0 provided in correspondence with block unit BU; a current supply section VC0a including a power supply wiring for supplying power supply voltage Vcc to write driver unit WDBU0; and a current supply section VC0b including a power supply wiring for supplying ground voltage GND to write driver unit WDBU0.

Write driver band WDB1 includes: a write driver unit WDBU1 provided in correspondence with block unit BU; a current supply section VC1a including a power supply wiring for supplying power supply voltage Vcc to write driver unit WDBU1; and a current supply section VC1b including a power supply wiring for supplying ground voltage GND to write driver unit WDBU1. This configuration can shorten power supply wirings, thus decreasing load during voltage supply. In other words, the wiring resistance of each power supply wiring is suppressed. Following this, the level of voltage drop based on the wiring resistances of the power supply wirings and the like is decreased during data write, making it possible to supply desired voltages and to perform a high speed data write operation.

Write driver unit WDBU0 includes a driver unit DU0 which is provided in correspondence with bit line BL on one end of bit line BL, which receives power supply voltage Vcc and ground voltage GND from current supply sections VC0a and VC0b, respectively, and which supplies a data write current to corresponding bit line BL. Write driver unit WDBU1 includes a driver unit DU1 which is provided in correspondence with bit line BL0 on the other end of bit line BL, which receives power supply voltage Vcc and ground voltage GND from current supply sections VC1a and VC1b, respectively, and which supplies a data write current to corresponding bit line BL. In FIG. 6, driver units DU0 and DU1 provided in correspondence with bit line BL0 are typically shown. Driver units equal in configuration are similarly designed for the other bit lines BL.

Current supply section VC0a includes: a transistor Tp which is arranged between a voltage supply node Np and power supply voltage Vcc and which has a gate receiving the input of a control signal /PC; and a capacitor Cp which is arranged between ground voltage GND and voltage supply node Np. Current supply section VC0b includes: a transistor Tn which is arranged between ground voltage GND and a voltage supply node Nq and which has a gate receiving the input of a control signal PC; and a capacitor Cq which is arranged between power supply voltage Vcc and voltage supply node Nq. Since current supply sections VC0a and VC1a are equal in circuit configuration and current supply section VC0b and current supply section VC1b are also equal in circuit configuration, they will not be repeatedly described herein. As an example, transistor Tn is an N-channel MOS transistor, and transistor Tp is a P-channel MOS transistor.

Further, block BU is provided with two data line pairs DBP in correspondence with respective bit lines BL. In this embodiment, data line pairs DBP0 and DBP1 provided in correspondence with bit line BL0 are typically shown. It is noted that data line pair DBP is a generic term of a data line pair.

Write driver unit WDBU1 further includes a data controller DCT which is provided for each bit line BL, and which generates data signals transmitted to two data line pairs DBP0 and DBP1 in accordance with the write data from data input control circuit 125 and a column select result based on the input of column address CA from a column decoder included in column select circuit 25 which is not shown in FIG. 6. In this embodiment, data controller DCT typically receives the input of write data WDT0 among write data WDT<3:0>. Write data WDT<3:0> are inputted to respective write driver units WDBU1 which perform parallel data write to divided block units BU.

Figure 7A:
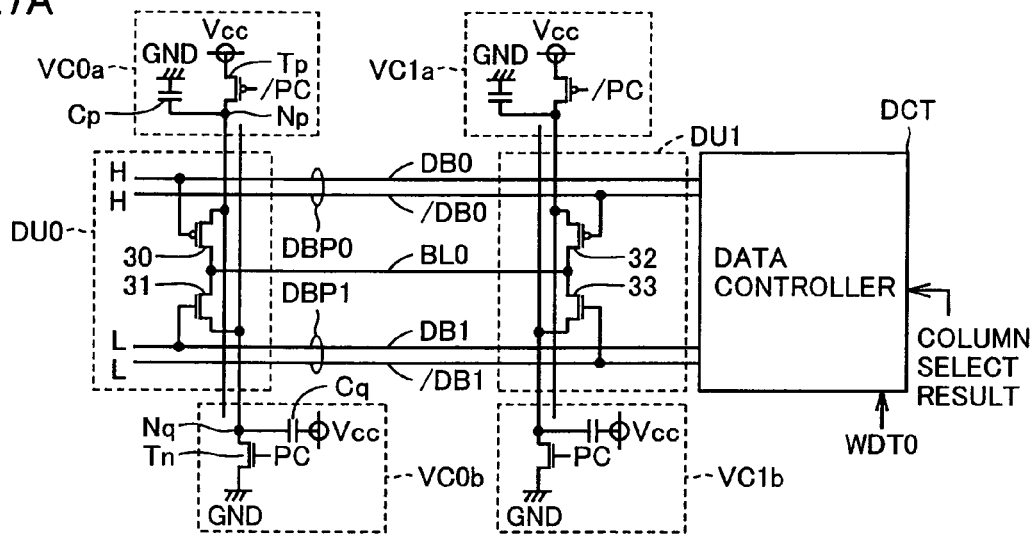
FIGS. 7A to 7C are conceptual diagrams for describing the operations of driver units in a normal state and during data write in detail.

With reference to FIG. 7A, driver unit DU0 includes transistors 30 and 31. Transistor 30 is arranged between one end of bit line BL0 and voltage supply node Np of current supply section VO0a and has a gate electrically coupled to one data line DB0 of data line pair DBP0. Transistor 31 is arranged between one end of bit line BL0 and voltage supply node Nq of current supply section VO0b and has a gate electrically coupled to one data line DB1 of data line pair DBP1. Driver unit DU1 includes transistors 32 and 33. Transistor 32 is arranged between the other end of bit line BL0 and current supply section VC1a and has a gate electrically coupled to the other data line /DB0 of data line pair DBP0. Transistor 33 is arranged between the other end of bit line BL0 and current supply section VC1*b* and has a gate electrically coupled to the other data line /DB1 of data line pair DBP1.

It is noted that transistors 30 and 32 are P-channel MOS transistors as an example. Further, transistors 31 and 33 are N-channel MOS transistors as an example.

Data controller DCT drives data line pairs DBP0 and DBP1 in response to the input of write data WDT0 and the column select result of the column decoder, not shown. Specifically, data controller DCT sets two data line pairs DBP0 and DBP1 at "H" level and "L" level, respectively, in normal operation. The respective transistors are, therefore, turned off, bit line BL0 is electrically isolated from the power supply wiring, and no data write current is supplied. In this embodiment, it is assumed that bit line BL0 is selected on the basis of the column select result of the column decoder, not shown.

Figure 7B:
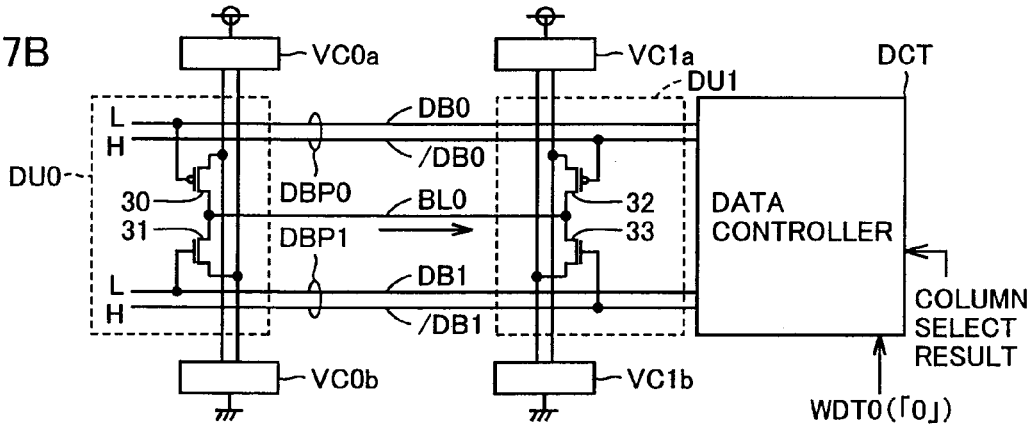

With reference to FIG. 7B, data controller DCT sets data lines DB0 and /DB0 of data line pair DBP0 at "L" level and "H" level, respectively, in response to the input of write data WDT0 (data "0") and the column select result. In addition, data controller DCT sets data lines DB1 and /DB1 of data line pair DBP1 at "L" level and "H" level, respectively. Accordingly, transistors 30 and 33 are turned on, and a data write current is supplied from one end to the other end of bit line BL0.

Figure 7C:
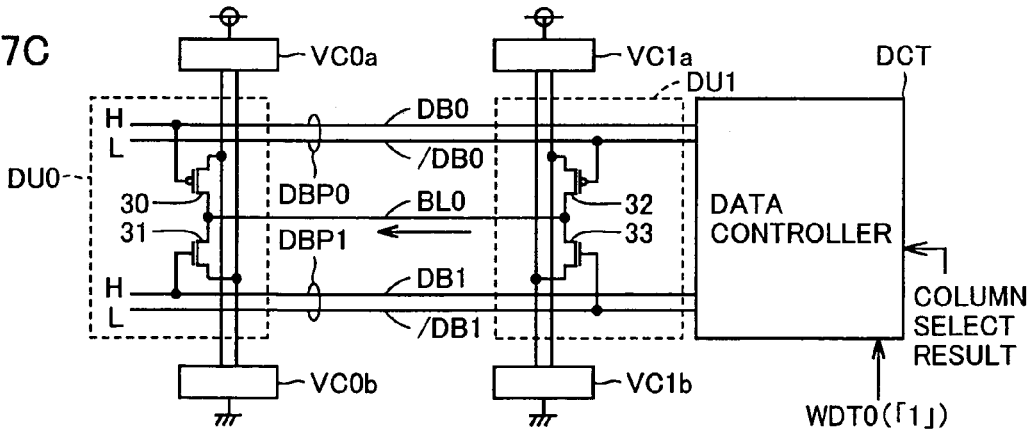

With reference to FIG. 7C, data controller DCT sets data lines DB0 and /DB0 of data line pair DBP0 at "H" level and "L" level, respectively, in response to the input of write data WDT0 (data "1") and the column select result. In addition, data controller DCT sets data lines DB1 and /DB1 of data line pair DBP1 at "H" level and "L" level, respectively. Accordingly, transistors 31 and 32 are turned on, and a data write current is supplied from the other end to one end of bit line BL0.

With reference to the timing chart of FIG. 8, a data write operation according to the first embodiment will be described. In this embodiment, it is assumed that various internal circuit operations are performed synchronously with clock signal CLK.

Figure 8:
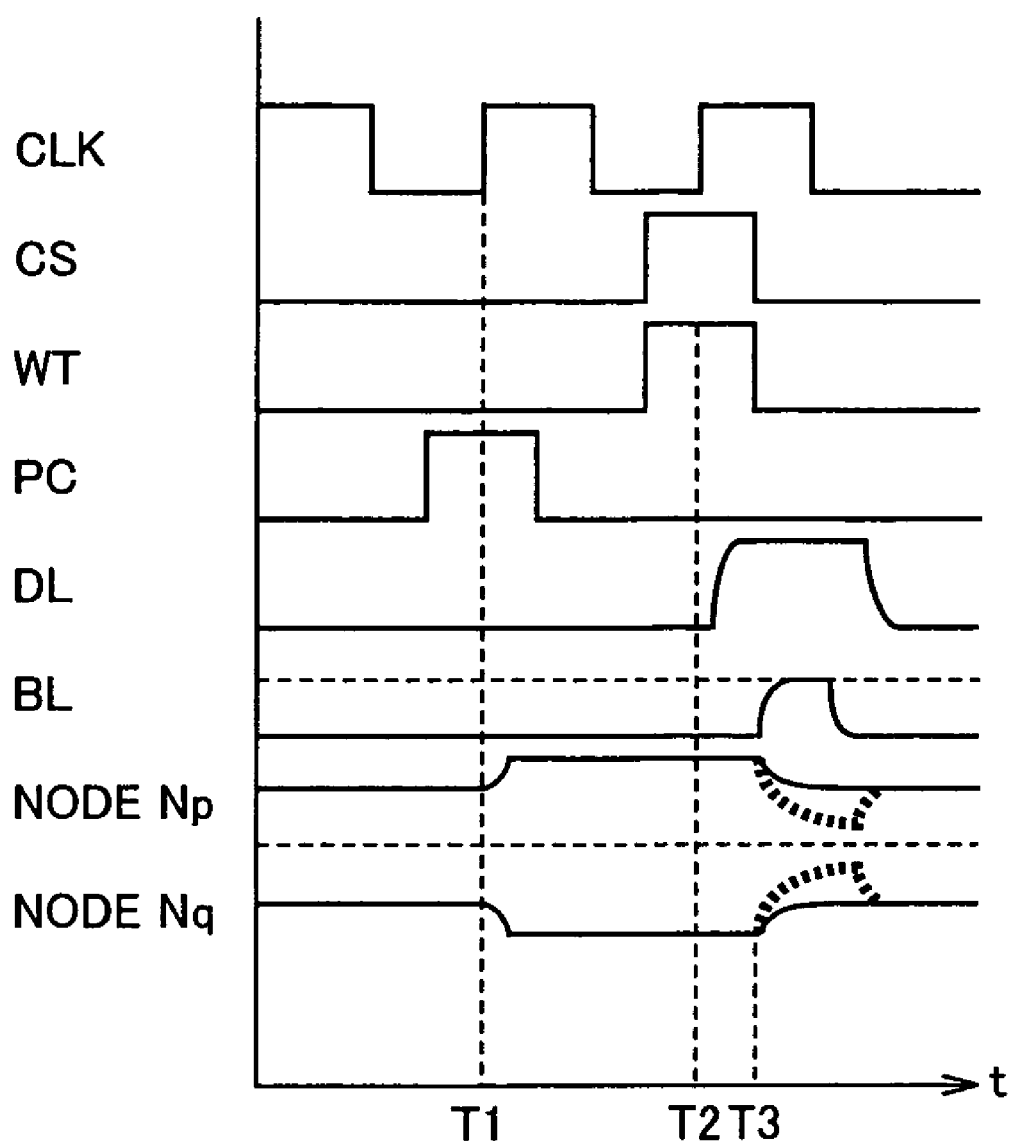
FIG. 8 is a timing chart for describing a data write operation according to the first embodiment of the present invention.

With reference to FIG. 8, at time T1 synchronized with the rising of clock signal CLK, control circuit 5 sets control signal PC at "H" level in response to the input of a precharge command, not shown. Accordingly, in current supply section VC0*a*, transistor Tp is turned on and capacitor Cp is charged. In addition, in current supply section VC0*b*, transistor Tn is turned on and capacitor Cq is charged. In the configuration of this embodiment, the data write current is supplied to bit line BL on the basis of the electric charges charged to capacitors Cp and Cq.

Next, at time T2, control signals CS and WT are inputted. Accordingly, control circuit 5 transmits a data write operation instruction to each internal circuit. In response to an address signal ADD to be inputted, not shown, the row decoder and the column decoder perform column selection and row selection for a select target memory block.

Further, although not shown in FIG. 8, almost at the same timing as time T2, control signal WE is set at "H" level. Accordingly, transistor Td is turned on and digit line DL is pulled down to ground voltage GND. Therefore, the data write current is supplied from the selected digit line driver band to selected digit line DL.

At time T3, although not shown in FIG. 8, data controller DCT generates a data signal in response to write data WDT from data input control circuit 125, and transmits the data signal to data line pair DBP. Accordingly, driver units DU0 and DU1 perform performs the operations described with reference to FIGS. 7A to 7C. For example, when transistor 30 is turned on, one end of bit line BL is electrically coupled to current supply section VC0*a*. On the other hand, when transistor 33 is turned on, the other end of bit line BL is electrically coupled to current supply section VC1*b*.

Following this, the electric charges are carried from node Np of capacitor Cp charged by power supply voltage Vcc to node Nq of capacitor Cq charged by ground voltage GND. That is, the data write current according to this potential difference is supplied to bit line BL.

By supplying the data write current on the basis of the electric charges charged to capacitors Cp and Cq as described above, it is possible to suppress the voltage changes of voltage supply nodes Np and Nq, i.e., voltage changes as indicated by the dotted lines in FIG. 5, as compared with the configuration in which power supply voltage Vcc and ground voltage GND are directly supplied to voltage supply nodes Np and Nq without providing capacitors, respectively.

Consequently, it is possible to supply a desired data write current as early as possible, and to thereby perform high speed data write.

With this configuration, write data <3:0> are generated by data input control circuit 125, and transmitted to respective write driver units WDBU corresponding to each block unit BU. Accordingly, it is possible to perform data write to the selected memory cells corresponding to the common digit line in respective block unit BU in parallel.

Capacitors Cp and Cq described in the first embodiment may be designed using so-called MOS capacitance elements made of so-called parallel plane capacitors and MOS transistors, or so-called junction capacitance elements having PN junctions.

In the configuration of this embodiment, the capacitances of the respective capacitors Cp and Cq can be adjusted by adjusting the sizes of capacitors Cp and Cq. Accordingly, the amount of the data write current carried to bit line BL can be adjusted.

Second Embodiment

Figure 9:
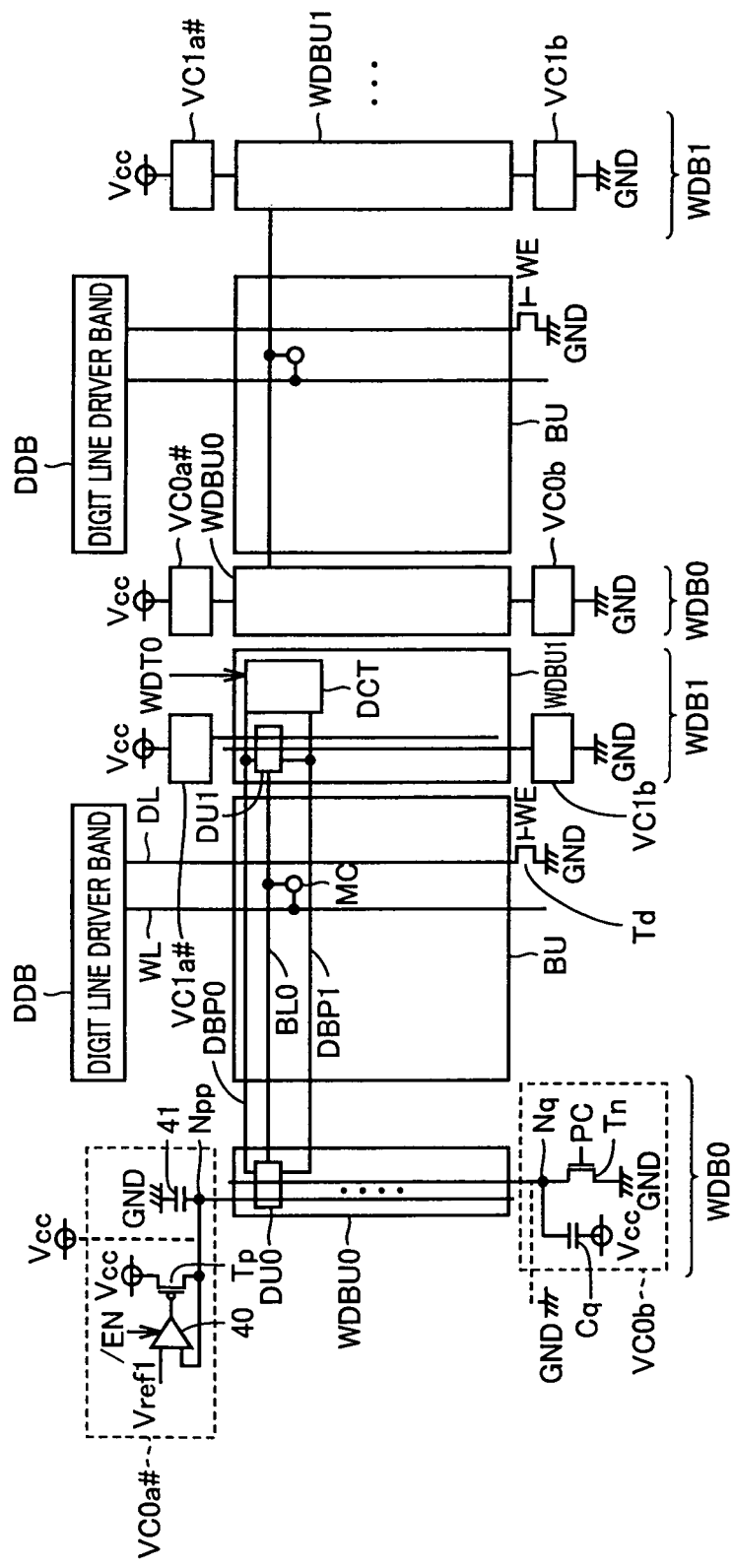
FIG. 9 is a conceptual diagram of a current driving circuit according to a second embodiment of the present invention.

With reference to FIG. 9, a current driving circuit according to a second embodiment differs from that according to the first embodiment described with reference to FIG. 6 in that current supply sections VC0*a* and VC1*a* are replaced by current supply sections VC0*a*# and VC1*a*#, respectively. Since the other constituent elements of the circuit are similar to those described in the first embodiment, they will not be repeatedly described herein in detail. Since current supply sections VC0*a*# and VC1*a*# are equal in configuration, current supply section VC0*a*# will be typically described.

Current supply section VC0*a*# includes a voltage drop circuit 40 (hereinafter, also referred to as "VDC circuit 40"), transistor Tp, and a capacitor 41.

VDC circuit 40 is activated in response to the input of a control signal /EN (at "L" level), receives a reference voltage Vref1 and a voltage supplied from a voltage supply node Npp, and outputs a voltage signal to the gate of transistor Tp. Transistor Tp is arranged between power supply voltage Vcc and voltage supply node Npp, and has a gate receiving the input of the output signal of VDC circuit 40. Capacitor 41 is arranged between ground voltage GND and voltage supply node Npp. Capacitor 41 is provided to serve as a so-called stabilization capacitance.

VDC circuit 40 adjusts a voltage signal outputted to transistor Tp so that the voltage level of voltage supply node Npp is equal to that of reference voltage Vref1. Accordingly, the voltage level of reference voltage Vref1 is adjusted, so that the voltage level of voltage supply node Npp can be adjusted.

With reference to the timing chart of FIG. 10, a data write operation according to the second embodiment of the present invention will be described.

At time T1 synchronized with the rising of clock signal CLK, control signals CS and WT both at "H" level are inputted. Accordingly, control circuit 5 transmits a data write operation instruction to each internal circuit.

Although not shown, in response to address signal ADD to be inputted, the row decoder and the column decoder perform column selection and row selection for a select target memory block.

Almost at the same timing as time T1, digit line DL is activated.

In addition, at time T2, control signal/EN is set at "L" level. Accordingly, VDC circuit 40 of current supply section VC0a# is activated. Further, although not shown, data controller DCT generates a data signal in response to write data WDT from data input control circuit 125, and transmits the data signal to data line pair DBP. Accordingly, driver units DU0 and DU1 perform the operations described with reference to FIGS. 7A to 7C, and intend to supply a data write current to selected bit line BL. At this moment, because of the wiring resistance of the power supply wiring, the voltage level of voltage supply node Npp is to be dropped. However, VDC circuit 40 can adjust the voltage level of voltage supply node Npp in response to the input of reference voltage Vref1, and suppress the voltage change level of voltage supply node Npp on the basis of the electric charges discharged from capacitor 41.

Following this, it is possible to supply the desired data write current to selected memory cell MC, and to perform the high speed data write operation similar to that in the first embodiment.

Next, at time T3, control signals CS and WS both at "H" level are inputted similarly to time T1. Accordingly, the similar operations to those at time T1 are performed at time T3. Further, the similar operations as described in respect of time T2 are performed. Therefore, by continuously inputting control signals CS and WT at "H" level synchronously with clock signal CLK, a continuous data write operation, so-called burst write operation, can be performed.

With this configuration, it is possible to supply the voltage at desired voltage level to voltage supply node Npp by adjusting reference voltage Vref1 in consideration of the voltage drop following the wiring resistances of the power supply wiring and the bit lines. Accordingly, it is possible to supply a stable data write current, and to perform an accurate data write operation.

Differently from the configuration of the first embodiment, the data write current is not supplied to the selected bit line on the basis of only the electric charges charged to the capacitors. Therefore, the capacitance of capacitor 41 can be set smaller than that of capacitor Cp, i.e., the area occupied by capacitor 41 can be reduced.

With this configuration, in each of voltage supply sections VC0b and VC1b, capacitor Cq is charged by ground voltage GND and the data write current is carried to node Nq. Alternatively, in each of voltage supply section Vc0b and VC1b, transistor Tn may be eliminated and ground node GND may be directly, electrically coupled to node Nq. This also applies to the following modifications.

First Modification of Second Embodiment

Figure 11:
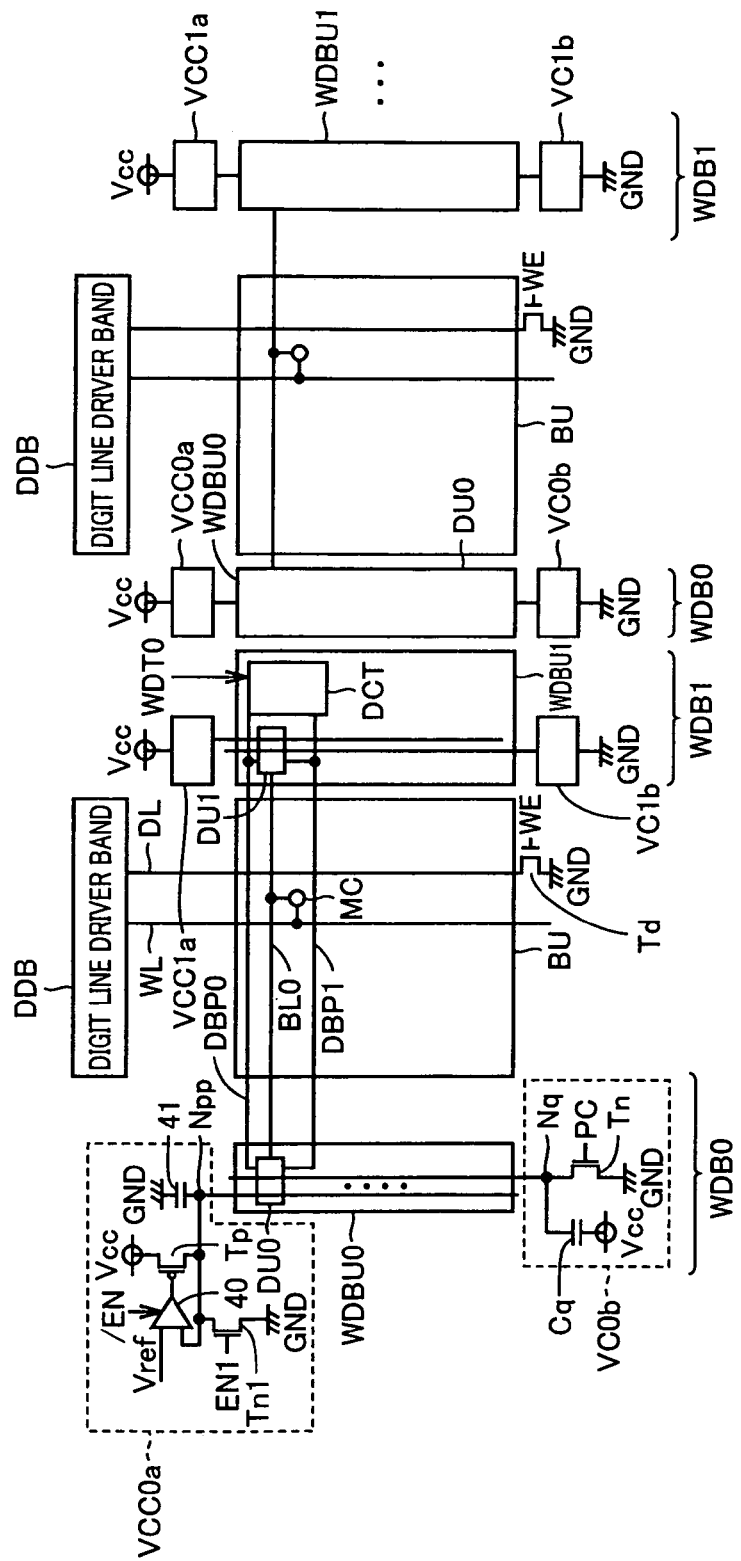
FIG. 11 is a conceptual diagram of a current driving circuit according to a first modification of the second embodiment of the present invention.

With reference to FIG. 11, a current driving circuit according to a first modification of the second embodiment of the present invention differs from that in the second embodiment shown in FIG. 9 in that current supply sections VC0a# and VC1a# are replaced by current supply sections VCC0a and VCC1a, respectively. Since the other constituent elements of the circuit are similar to those in the second embodiment, they will not be repeatedly described herein in detail. Since current supply sections VCC0a and VCC1a are similar in circuit configuration, current supply section VCC0a will be typically described herein.

Current supply section VCC0a differs from current supply section VC0a# in that a transistor Tn1 is added between voltage supply node Npp and ground voltage GND. Since the other constituent elements of current supply section VCC0a are similar to those of current supply section VC0a# described with reference to FIG. 9, they will not be repeatedly described herein.

Transistor Tn1 is turned on in response to the input of a control signal EN1, and electrically couples voltage supply node Npp to ground node GND.

In the second embodiment, the configuration in which VDC circuit 40 which receives the input of reference voltage Vref1 is used for adjusting the voltage level of voltage supply node Npp, to thereby stably supply the data write current has been described.

However, after the voltage level of voltage supply node Npp changes, VDC circuit 40 operates and adjusts the voltage level of voltage supply node Npp through transistor Tp. Accordingly, it takes a required adjustment period to adjust the voltage level of voltage supply node Npp.

The current driving circuit according to the first modification of the second embodiment of the present invention supplies a stable data write current at higher speed than that of the current driving circuit described in the second embodiment. This configuration will be described.

With reference to the timing chart of FIG. 12, a data write operation according to the first modification of the second embodiment of the present invention will be described.

Figure 10:
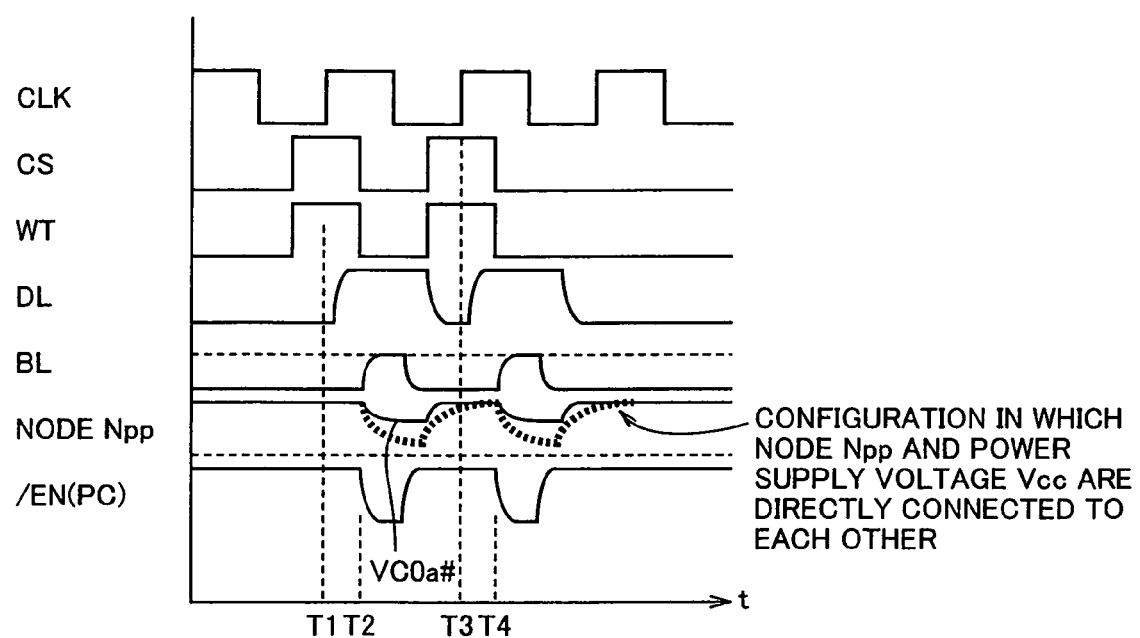
FIG. 10 is a timing chart for describing a data write operation according to the second embodiment of the present invention.
Figure 12:
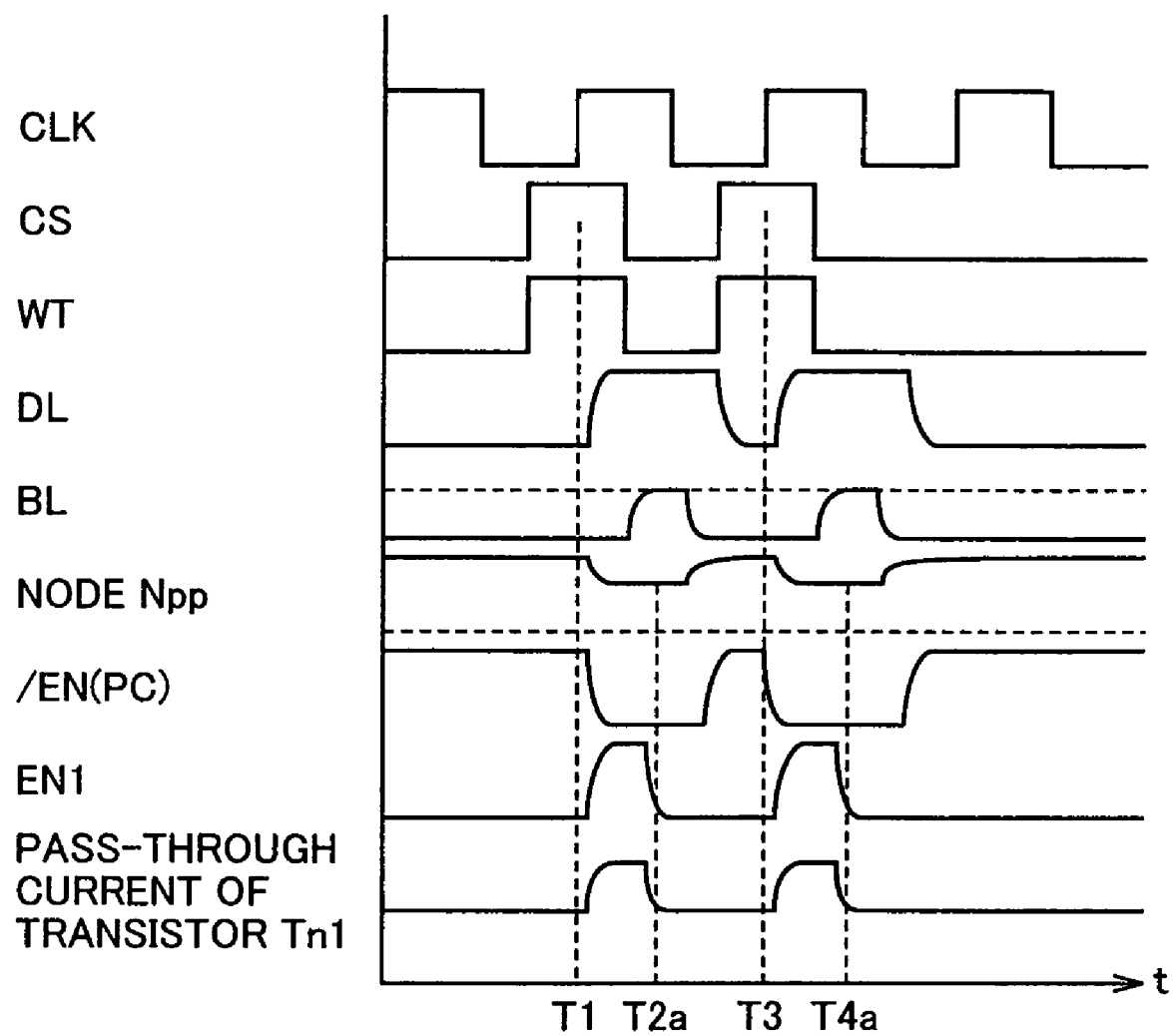
FIG. 12 is a timing chart for describing a data write operation according to the first modification of the second embodiment of the present invention.

With reference to FIG. 12, control signals CS and WT both set at "H" level are inputted synchronously with clock signal CLK as in the case of FIG. 10, and control circuit 5 performs a data write operation in response to the input of control signals CS and WT. Specifically, according to the same procedures as those described above, digit line DL is activated (set at "H" level).

In this modification, control signal/EN is set at "L" level almost at the same timing as the activation of digit line DL. In addition, control signal EN1 is set at "H" level. Accordingly, VDC circuit 40 is activated. Further, ground voltage GND is electrically coupled to voltage supply node Npp through transistor Tn1 in response to control signal EN1. Following this, a current path from power supply voltage Vcc to ground voltage GND through transistors Tp and Tn1 is formed.

In this configuration, the size of transistor Tn1 is designed so as to have the resistance similar to that of the power supply wiring and that of the bit line wiring. With the designing, it is possible to supply a different simulated dummy current from the normal data write current to be supplied to bit line BL, to the path through transistor Tn1.

Next, at time T2a which is almost the same timing as that at which the dummy current is stably supplied, control signal EN1 is turned off. As a result, no dummy current is carried to the current path through transistor Tn1.

Further, at the timing similar to time T2a, data controller DCT generates a data signal in response to write data WDT from data input control circuit 25, not shown, and transmits the data signal to data line pair DBP. Following this, driver units DU0 and DU1 performs the operations as described with reference to FIGS. 7A–7C, and intends to supply the data write current to selected bit line BL.

With this configuration, therefore, the dummy current is supplied in advance, thereby adjusting the voltage change of voltage supply node Npp in VDC circuit 40 in advance. Accordingly, it is possible to promptly supply a stable, normal data write current almost the same as the dummy current to bit line BL, and to thereby perform a high speed data write operation.

Second Modification of Second Embodiment

In the first modification of the second embodiment, the dummy current is supplied prior to the normal data write current from the voltage supply section, the voltage level of voltage supply node Npp is adjusted, and the data write current is then supplied. With this configuration, the data write operation is accelerated.

In a second modification of the second embodiment, the configuration in which desired reference voltage Vref1 is supplied to VDC circuit 40 will be described.

Figure 13:
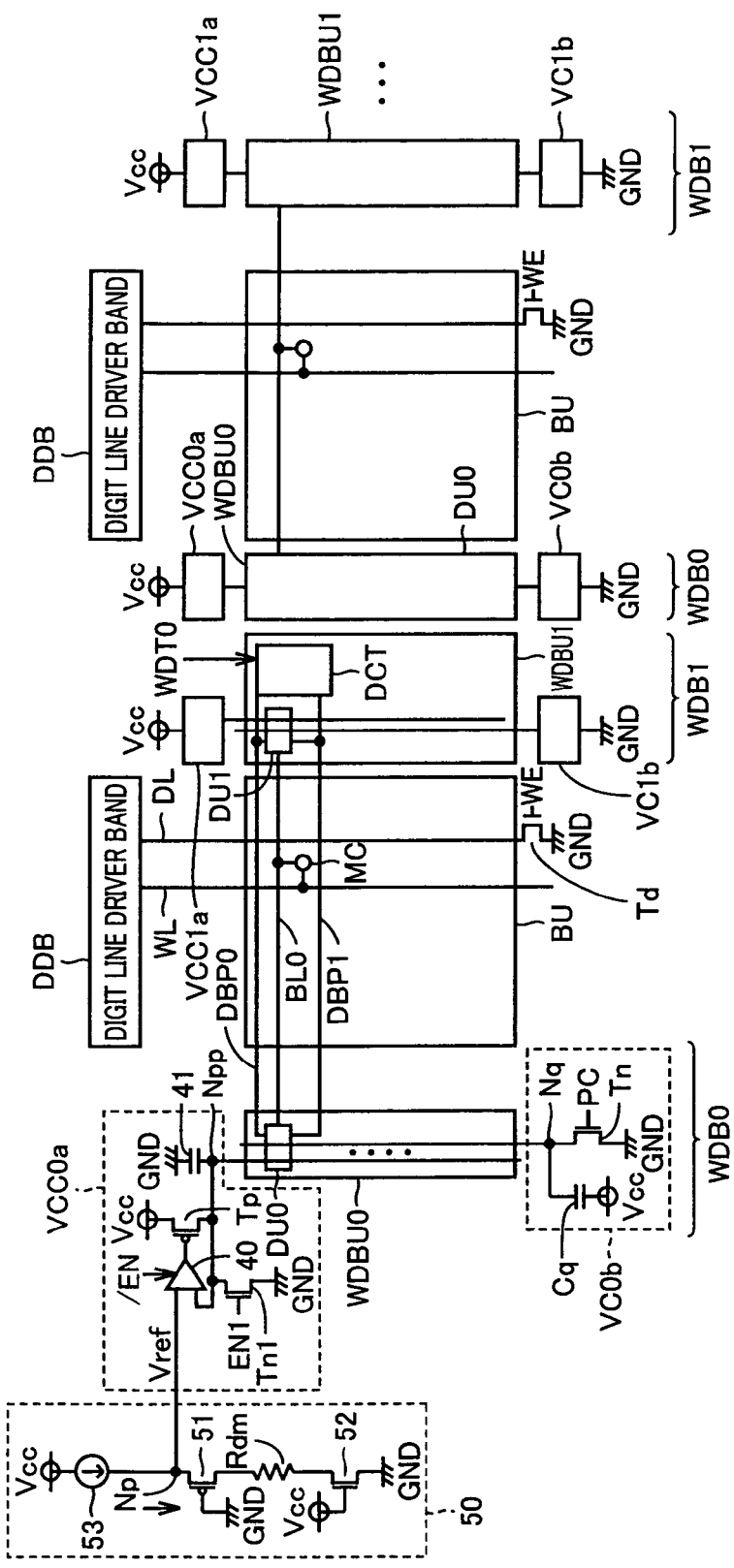
FIG. 13 is a conceptual diagram of a current driving circuit according to a second modification of the second embodiment of the present invention.

With reference to FIG. 13, a current driving circuit according to the second modification of the second embodiment of the present invention differs from that described in the first modification of the second embodiment with reference to FIG. 10 in that a reference voltage generation circuit 50 is further provided. Since the other constituent elements are similar to those described with reference to FIG. 10, they will not be repeatedly described herein.

Reference voltage generation circuit 50 includes a predetermined-current source 53 which supplies a reference current, transistors 51 and 52, a resistance Rdm and the like. Predetermined-current source 53 receives the supply of power supply voltage Vcc, and is provided between power supply voltage Vcc and node Np. Transistor 51, resistance Rdm and transistor 52 are connected in series between node Np and ground voltage GND, and the gate of transistor 51 is coupled to ground voltage GND. Further, the gate of transistor 52 is electrically coupled to the gate of power supply voltage Vcc. Herein, it is assumed that transistor 51 is a P-channel MOS transistor and that transistor 52 is an N-channel MOS transistor.

Transistors 51 and 52 are formed as a group of transistors which are formed as dummies through which the data write current passes when the data write current is supplied to bit line BL. Specifically, transistors 51 and 52 are designed to have the transistor sizes similar to those of transistors 30 and 33 or transistors 32 and 31. Further, resistance Rdm is the wiring resistance of bit line BL or the like which is provided as a dummy. Resistance Rdm may be a resistance element equivalent to the wiring resistance of bit line BL or the like or constituted to arrange a signal line similar in length to bit line BL or the like. In the latter case, the signal line may be formed on the same wiring layer as that of bit line BL and set to have the same wiring width, whereby the signal line having a wiring resistance value equivalent to that of bit line BL or the like can be designed.

Therefore, reference voltage generation circuit 50 generates desired reference voltage Vref1 in accordance with the reference current supplied from predetermined-current source 53 to node Np. That is, reference voltage generation circuit 50 forms an equivalent current path to the current path through which the data write current flows in a simulated manner, thereby making it possible to supply reference voltage Vref1 to voltage supply node Npp and to supply the same data write current as the reference current to the selected bit line. As a result, it is possible to generate highly accurate reference voltage Vref1 by adjusting the reference current, and to supply the desired data write current.

In this modification, the configuration in which one reference voltage generation circuit 50 is provided in correspondence with current supply section VCC0a has been typically described. Alternatively, this configuration can be provided for each current supply section or commonly provided to each current supply section.

Third Modification of Second Embodiment

In the second modification of the second embodiment, the configuration in which highly accurate reference voltage Vref1 is generated by reference voltage generation circuit 50 to thereby supply the desired data write current, has been described. However, depending on operation environment (operation temperature), the data rewrite characteristics of the memory cell changes during data write.

In a third modification of the second embodiment, a circuit configuration in which a data write current can be adjusted in accordance with a change in data rewrite characteristics following the operation environment of the memory cell will be described.

Figure 14:
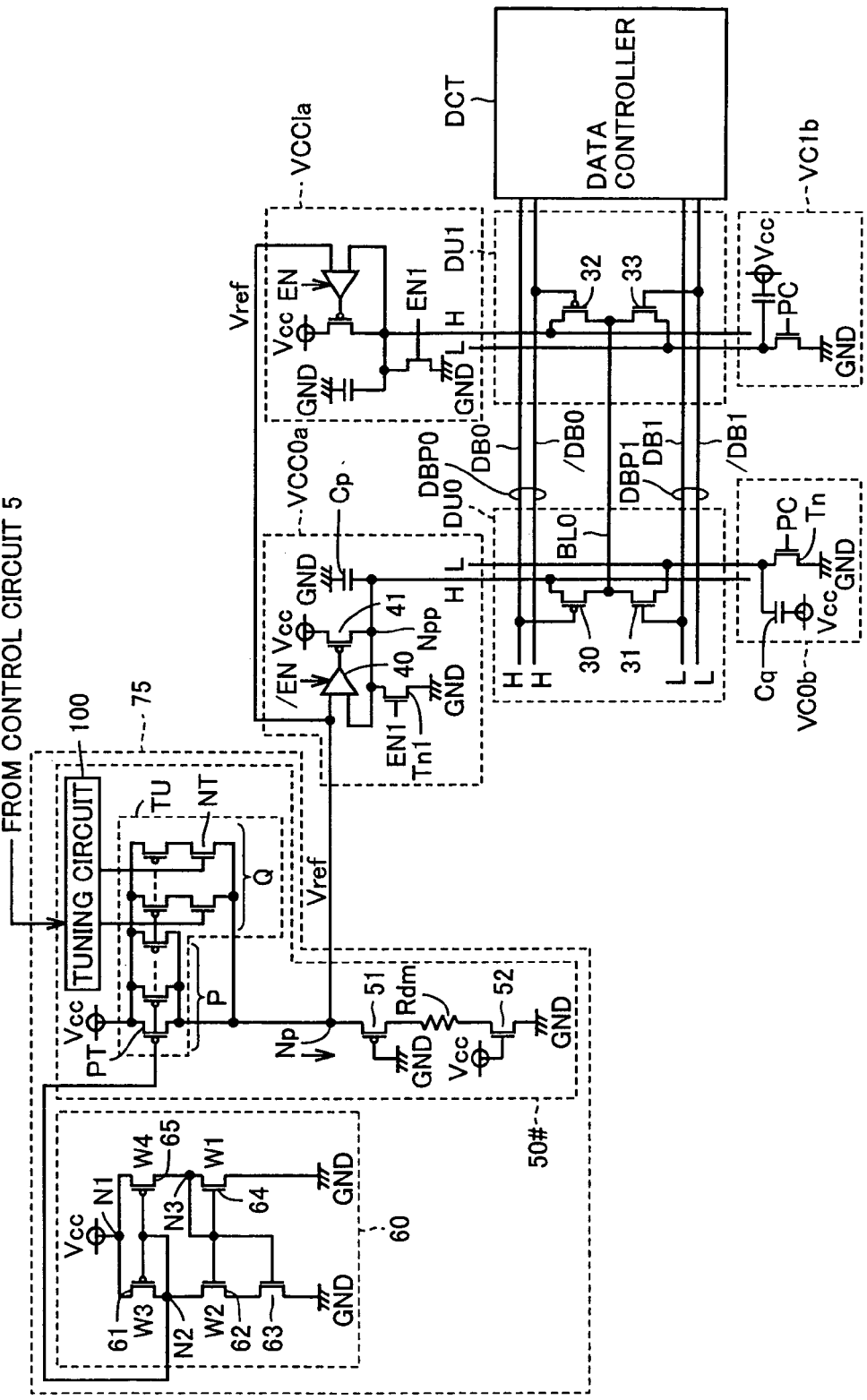
FIG. 14 is a circuit block diagram of a reference voltage generation circuit which generates a reference voltage supplied to a current supply section, and a peripheral circuit diagram of the block unit.

With reference to FIG. 14, a reference voltage generation circuit 75 according to the third modification of the second embodiment includes a predetermined-current generation circuit 60, and a reference voltage generation unit 50# which generates reference voltage Vref1.

Predetermined-current generation circuit 60 includes transistors 61 to 65. Transistor 61 is arranged between anode N1 electrically coupled to power supply voltage Vcc and an output node N2, and has a gate electrically coupled to node N2. Transistors 62 and 63 are arranged between node N2 and ground voltage GND, and have gates electrically coupled to a node N3, respectively. Transistor 64 is arranged between node N3 and ground voltage GND so that transistors 64 and 62 constitute a current-mirror circuit, and has a gate electrically coupled to node N3. Transistor 65 is arranged between nodes N1 and N3 which receive the supply of power supply voltage Vcc so that transistors 65 and 61 constitute a current-mirror circuit, and has a gate electrically coupled to node N1. Predetermined-current generation circuit 60 adjusts a pass-through current which is carried to the respective transistors in accordance with the operation environment. As an example, transistors 61 and 65 are P-channel MOS transistors, and transistors 62 to 64 are N-channel MOS transistors. The amount of current Ip which passes through predetermined-current generation circuit 60 is represented by the following formula:

$$I_p = \frac{\left(\frac{kT}{q}\right)\ln\left(\frac{W2}{W1} \times \frac{W4}{W3}\right)}{R1}$$

In the formula, k represents Boltzmann's constant, T represents absolute temperature, q represents the quantity of charges, R1 represents the ON resistance of transistor 63, and W1 to W4 represent the transistor sizes of transistors 64, 62, 61 and 65, respectively.

ON resistance R1 of transistor 63 depends on temperature, and rises at high operation temperature. Following this, current amount Ip decreases. On the other hand, at low operation temperature, ON resistance R1 decreases. Following this, current amount Ip increases. It is noted that transistor 63 can be designed using a polysilicon material having high temperature dependence.

Reference voltage generation unit 50# includes a tuning circuit 100, a tuning unit TU, transistors 51 and 52, and resistance Rdm. Reference voltage generation unit 50# differs from reference voltage generation circuit 50 by further providing tuning unit TU and tuning circuit 100. Since the other constituent elements of reference voltage generation unit 50# are similar to those of reference voltage generation circuit 50, they will not be repeatedly described herein.

Tuning unit TU includes: a transistor group having P transistors PT arranged in parallel between power supply voltage Vcc and node Np; and a transistor group connected in series to transistor NT which is turned on in response to a decode signal from tuning circuit 100, and having Q transistors PT arranged in parallel between power supply voltage Vcc and node Np. Transistor PT is equal in size to transistor 61 of predetermined-current generation circuit 60. P transistors PT are turned on, so that current amount which is P times as large as current amount Ip is supplied to output node Np. P transistors PT can be freely designed in accordance with the current amount supplied to output node Np. In addition, in response to an instruction signal from control circuit 5, tuning circuit 100 generates a decode signal. In response to this decode signal, transistor NT is turned on. Accordingly, it is possible to make finer adjustment to the current to be supplied to output node Np in response to the instruction signal from control circuit 5. Likewise, Q transistors PT can be freely designed in accordance with the current amount supplied to output node Np.

Figure 15:
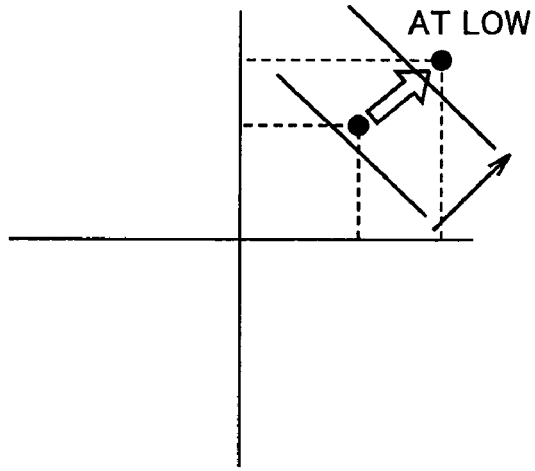
FIG. 15 is a conceptual diagram for describing the state where an asteroid characteristic curve at an ordinary temperature operation (room temperature operation) transits at a low temperature operation.

With reference to FIG. 15, a case where the asteroid characteristic curve at ordinary temperature operation (room temperature) transits at low temperature operation will be described.

As shown in FIG. 15, at the low temperature operation, the asteroid characteristic curve transits in a direction away from the center. Therefore, during data write at the low temperature operation, it is necessary to increase the amount of the data write current from that at the ordinary temperature operation. Thus, by employing the predetermined-current generation circuit constituted as described herein, it is possible to increase the quantity of the reference current at the low temperature operation. The reference voltage generation circuit according to the third modification of the second embodiment can generates a reference voltage in accordance with the operation environment, and supply a stable data write current.

Figure 16:
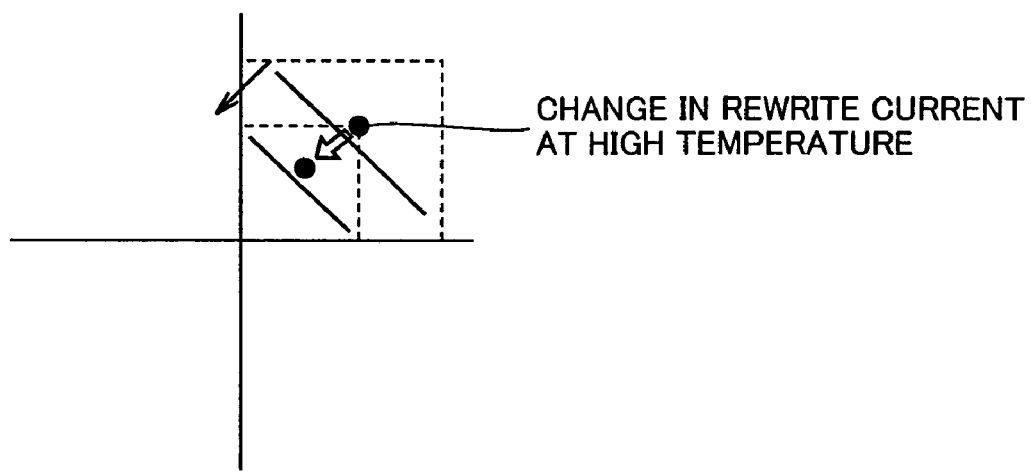
FIG. 16 is a conceptual diagram for describing the state where the asteroid characteristic curve at the ordinary temperature operation transits at a high temperature operation.

With reference to FIG. 16, a case where the asteroid characteristic curve at the ordinary temperature operation transits at high temperature operation will be described.

As shown in FIG. 16, at the high temperature operation, the asteroid characteristic curve transits in a direction close to the center. Therefore, during data write at the high temperature operation, it is possible to rewrite data sufficiently even if the amount of the data write current is decreased from that at the ordinary temperature operation.

Thus, by employing the predetermined-current generation circuit constituted as described herein, it is possible to decrease the quantity of the reference current at the high temperature operation. The reference voltage generation circuit according to the third modification of the second embodiment can generates a reference voltage in accordance with the operation environment, and supply a stable data write current. In addition, it is possible to decrease power consumption at the high temperature operation.

It is also possible to decrease the power consumption by supplying a reference current which amount is 1/L (where L is a natural number) as large as that of the normal data write current, to reference voltage generation unit 50#.

Specifically, tuning unit TU adjusts the current amount of the reference current to be 1/L as large as that of the normal data write current on the basis of the number of transistors PT, and multiplies the resistance value of resistance Rdm by L. Further, the transistor sizes of transistors 51 and 52 are set to be 1/L times as large as those of transistors 30 and 33 or 32 and 31.

Accordingly, it is possible to generate desired reference voltage Vref1, to decrease the reference current supplied to reference voltage generation unit 50#, and to decrease power consumption.

Third Embodiment

In the first and second embodiments, the configurations of supplying the desired data write current to bit line BL have been described.

In a third embodiment, the configuration of a digit line driver DV which drives digit line DL to which the data write current is supplied, will be described.

As described above, digit line driver DV selectively supplies the data write current in response to decode signal Rd from row decoder 21 which signal is transmitted to digit line driver DDB during data write.

Figure 17:
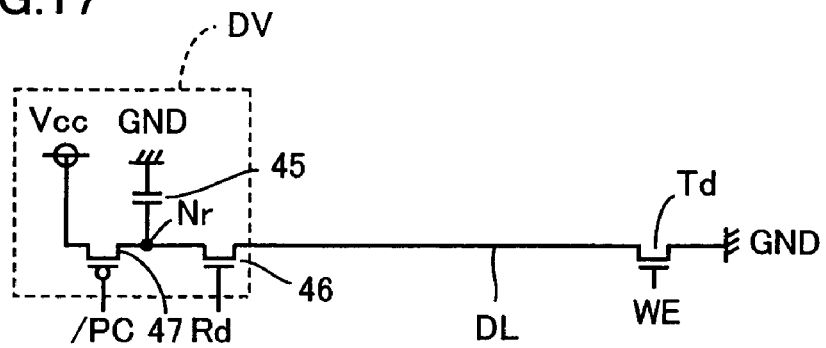
FIG. 17 is a circuit block diagram of a digit line driver according to a third embodiment of the present invention.

With reference to FIG. 17, digit line driver DV according to the third embodiment of the present invention includes transistors 46 and 47, and a capacitor 45. As an example, transistor 47 is a P-channel MOS transistor, and transistor 46 is an N-channel MOS transistor.

Transistor 46 is arranged between digit line DL and a voltage supply node Nr, and has a gate receiving the input of decode signal Rd. Capacitor 45 is arranged between voltage supply node Nr and ground voltage GND. Transistor 47 is arranged between voltage supply node Nr and power supply voltage Vcc, and has a gate receiving the input of control signal /PC.

In the third embodiment, similarly to the first embodiment, before data is written, control signal /PC is set (at "L" level) in response to an instruction from control circuit 5. In response to the setting, capacitor 45 is charged. During data write, transistor 47 is turned off in response to control signal /PC (at "H" level). Further, by inputting decode signal Rd to transistor 46, the data write current is supplied to digit line DL by the electric charges charged to capacitor 45. It is assumed that control signal WE is set at "H" level during data write as already described above. This also applies hereinafter.

Accordingly, similarly to the first embodiment, it is possible to prevent a sudden voltage change at voltage supply node Nr during data write, to supply the desired data write current to digit line DL, and to perform a high speed data write operation.

First Modification of Third Embodiment

In a first modification of the third embodiment of the present invention, the configuration of a digit line driver DV# which drives digit line DL to which the data write current is supplied will be described.

Figure 18:
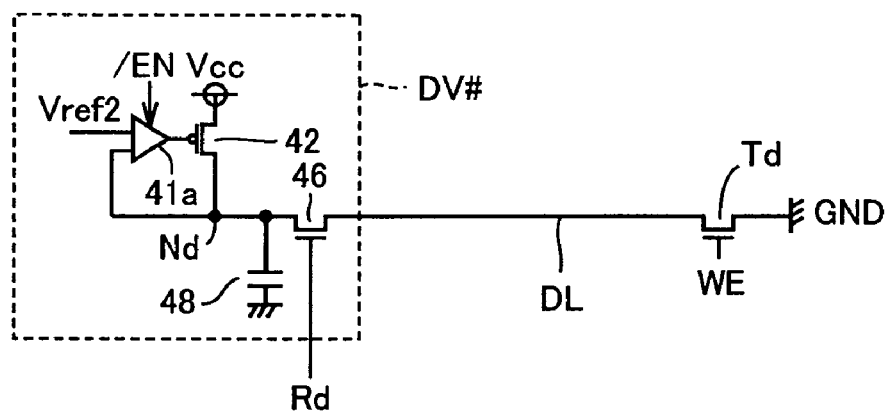
FIG. 18 is a circuit block diagram of a digit line driver according to a first modification of the third embodiment of the present invention.

With reference to FIG. 18, digit line driver DV# according to the first modification of the third embodiment of the present invention includes transistors 42 and 46, a VDC circuit 41*a*, and a capacitor 48. As an example, transistor 42 is a P-channel MOS transistor, and transistor 46 is an N-channel MOS transistor. Capacitor 48 is provided to serve as a so-called stabilization capacitance.

VDC circuit 41*a* is activated in response to the input of control signal/EN (at "L" level), receives a reference voltage Vref2 and a voltage supplied from a voltage supply node Nd, and outputs a voltage signal to the gate of transistor 42. Transistor 42 is arranged between power supply voltage Vcc and voltage supply node Nd, and has a gate receiving the output signal of VDC circuit 41*a*. Transistor 46 is arranged between voltage supply node Nd and digit line DL, and has a gate receiving the input of decode signal Rd. Capacitor 48 is arranged between node Nd and ground voltage GND.

VDC circuit 41*a* adjusts a voltage signal outputted to transistor 42 so that the voltage level of voltage supply node Nd is equal to that of reference voltage Vref2. Accordingly, the voltage level of reference voltage Vref2 is adjusted, so that the voltage drop of voltage supply node Nd following the wiring resistance of digit line DL can be adjusted. In addition, the sudden voltage change at voltage supply node Nd can be adjusted by capacitor 48.

With this configuration, it is possible to suppress the voltage change at the node Nd, to adjust reference voltage Vref2 in light of the voltage drop following the wiring resistance of digit line DL, to supply desired data write current to digit line DL, and to perform the high speed data write operation.

Differently from the configuration of the third embodiment, the data write current is not supplied to the selected digit line on the basis of only the electric charges charged to the capacitor. Due to this, the capacitance of capacitor 48 can be set smaller than that of capacitor 45, i.e., the area occupied by capacitor 48 can be reduced.

Second Modification of Third Embodiment

In a second modification of the third embodiment of the present invention, the configuration of a digit line driver DV#a which drives digit line DL to which the data write current is supplied will be described.

Figure 19:
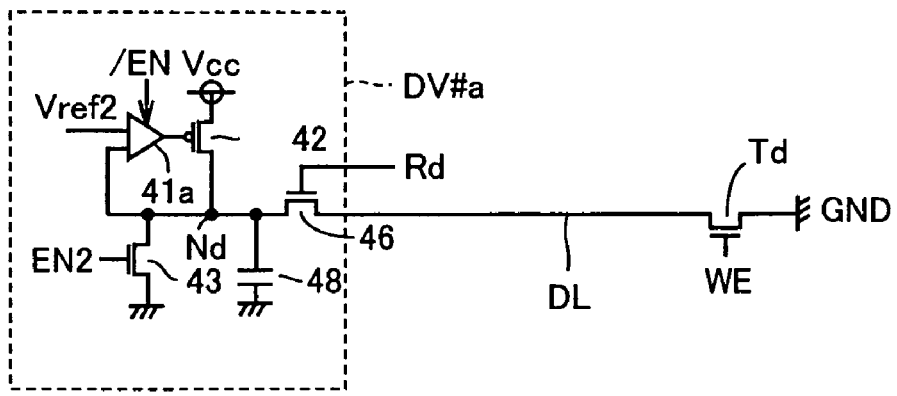
FIG. 19 is a circuit block diagram of a digit line driver according to a second modification of the third embodiment of the present invention.

With reference to FIG. 19, digit line driver DV#a according to the second modification of the third embodiment of the present invention differs from digit line driver DV# according to the first modification of the third embodiment by further providing a transistor 43. Since the other constituent elements of digit line driver DV#a are similar to those of digit line driver DV# according to the first modification of the third embodiment as described with reference to FIG. 18, they will not be repeatedly described herein. As an example, transistor 43 is an N-channel MOS transistor.

Digit line driver DV#a sets a control signal EN2 at "H" level before a data write current is supplied to digit line DL. Accordingly, a current path from power supply voltage Vcc to ground voltage GND through transistors 42 and 43 is formed. That is, a dummy current is carried to a selected digit line before a normal data write current is supplied thereto. Herein, transistor 43 is designed to have such a transistor size as to be similar in resistance value to the power supply wiring and the wiring resistance of the digit line.

Next, at the similar timing at which the dummy current is stably supplied, control signal TN2 is set at "L" level, and the path of the dummy current is shut off. At this similar timing, decode signal Rd (at "H" level) is inputted.

Following this, before the normal data write current is supplied to digit line DL, the dummy current is supplied thereto, and VDC circuit 41*a* adjusts the voltage level of voltage supply node Nd. It is thereby possible to adjust a voltage change at node Nd in advance, making it possible for digit line driver DV#a to supply a higher-speed, more stable data write current than that supplied by digit line driver DV# in the first modification of the third embodiment.

Third Modification of Third Embodiment

In the second modification of the third embodiment, the configuration in the case where digit line driver DV#a in which the dummy current is supplied before the normal dummy current is supplied, thereby adjusting the voltage level of voltage supply node Nd, and the normal data current is then supplied, thus accelerating the data write operation, has been described.

In a third modification of the third embodiment of the present invention, the configuration of supplying desired reference voltage Vref2 to VDC circuit 41*a* will be described.

Figure 20:
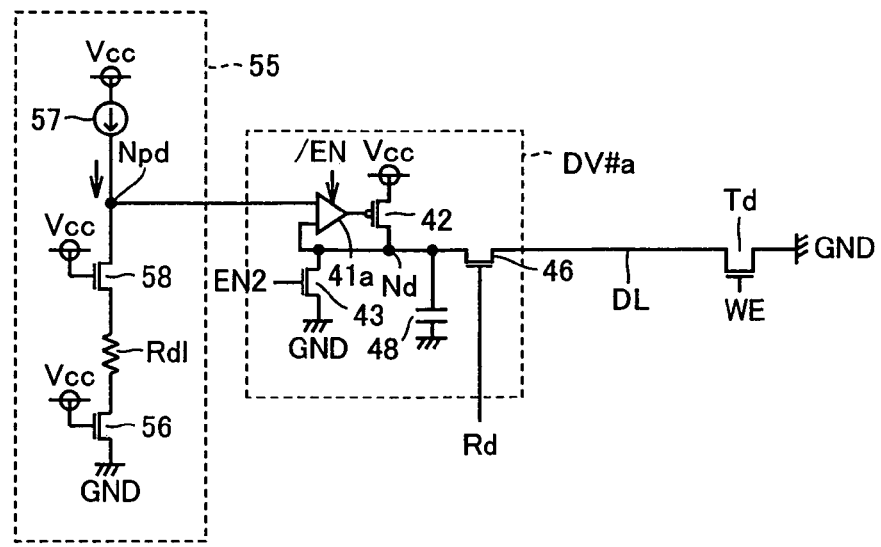
FIG. 20 is a conceptual diagram of a reference voltage generation circuit provided for the digit line driver.

With reference to FIG. 20, reference voltage generation circuit 55 provided for digit line driver DV#a includes a predetermined-current source 57 which supplies a reference current, transistors 56 and 58, and a resistance Rdl. Predetermined-current source 57 receives the supply of power supply voltage Vcc, and is provided between power supply voltage Vcc and an output node Npd. Transistor 58, resistance Rdl and transistor 56 are connected in series between output node Npd and ground voltage GND, and the gate of transistor 58 is electrically coupled to power supply voltage Vcc. In addition, the gate of transistor 56 is electrically coupled to power supply voltage Vcc. As an example herein, transistors 56 and 58 are N-channel MOS transistors.

Transistors 56 and 58 are formed as a group of transistors which are formed as dummies through which the data write current pass when the data write current is supplied to the digit line. Specifically, transistors 56 and 58 are designed to have the transistor sizes similar to those of transistors 46 and Td. Further, resistance Rdl is the wiring resistance of digit line DL or the like which intervenes on the data write current path as a dummy. Resistance Rdl may be a resistance element equivalent to the wiring resistance of digit line DL or the like or constituted to arrange a signal line similar in length to digit line DL or the like. In the latter case, the signal line may be formed on the same wiring layer as that of digit line DL and set to have the same wiring width, whereby the signal line having a wiring resistance value equivalent to that of digit line or the like can be designed.

Therefore, reference voltage generation circuit 55 generates desired reference voltage Vref2 in accordance with the reference current supplied from predetermined-current source 57 to output node Npd. That is, reference voltage generation circuit 55 forms an equivalent current path to the current path through which the data write current flows in a simulated manner, thereby making it possible to supply reference voltage Vref2 to output node Npd and to supply the data write current similar to the reference current to the selected bit line. As a result, it is possible to generate highly accurate reference voltage Vref2 by adjusting the reference current, and to supply the desired data write current.

In this modification, the configuration in which one reference voltage generation circuit 55 is provided in correspondence with digit line driver DV#a has been described. Alternatively, this configuration can be commonly provided to each of digit line drivers DV#.

Fourth Modification of Third Embodiment

In the third modification of the third embodiment, the configuration in which highly accurate reference voltage Vref2 is generated by reference voltage generation circuit 55 to thereby supply the desired data write current, has been described. However, depending on operation environment (operation temperature), the data rewrite characteristics of the memory cell changes during data write.

In a fourth modification of the third embodiment, a circuit configuration in which a data write current can be adjusted in accordance with a change in data rewrite characteristics following the operation environment of the memory cell will be described.

Figure 21:
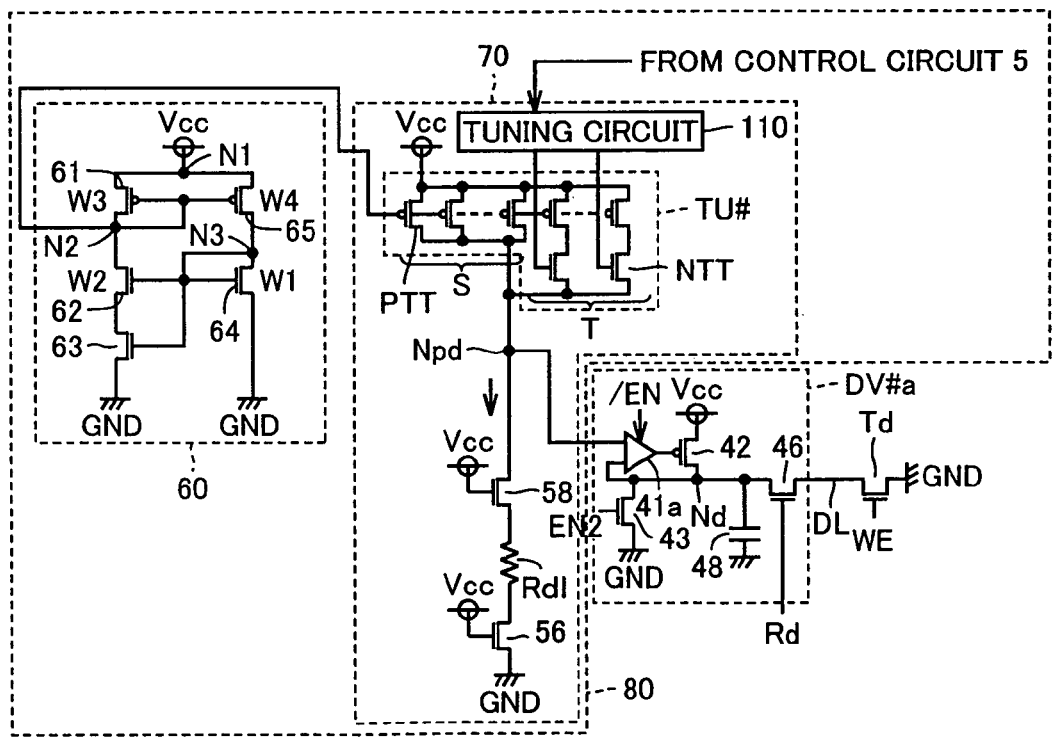
FIG. 21 is a circuit block diagram of a reference voltage generation circuit which can be replaced by the reference voltage generation circuit generating the reference voltage supplied to the digit line driver.

With reference to FIG. 21, a reference voltage generation circuit 80 can be replaced by reference voltage generation circuit 55 for generating reference voltage Vref2 which is supplied to digit line driver DV#a, and includes predetermined-current generation circuit 60, and a reference voltage generation unit 70 which generates reference voltage Vref2.

Predetermined-current generation circuit 60 is similar in circuit configuration to that shown in FIG. 14, it will not be described herein in detail. Reference voltage generation unit 70 differs from reference voltage generation circuit 55 in that a tuning unit TU# is provided for replacing predetermined-current source 57 and a tuning circuit 110 is further provided. Since the other constituent elements of reference voltage generation unit 70 are similar to those of reference voltage generation circuit 55, they will not be repeatedly described herein.

Tuning unit TU# includes: a transistor group having S transistors PTT arranged in parallel between power supply voltage Vcc and node Npd; and a transistor group connected in series to a transistor NTT which is turned on in response to a decode signal from tuning circuit 110, and having T transistors PTT arranged in parallel between power supply voltage Vcc and node Npd. Transistor PTT is same in size as transistor 61 of predetermined-current generation circuit 60. S transistors PTT are turned on, so that current amount Ip which is S times as large as current amount Ip which passes through circuit 60 is supplied to output node Npd. S transistors PTT can be freely designed in accordance with the current amount supplied to output node Npd. In addition, in response to an instruction signal from control circuit 5, tuning circuit 110 generates a decode signal. In response to this decode signal, transistor NTT is turned on. Accordingly, it is possible to make finer adjustment to the current to be supplied to output node Npd in response to the instruction signal from control circuit 5. Likewise, T transistors PTT can be freely designed in accordance with the current amount supplied to output node Npd. Accordingly, as described above, from the ordinary temperature operation (room temperature operation) to the low temperature operation or high temperature operation, it is possible generate the reference voltage according to the operation environment, and to supply the stable data write current.

It is noted that the 1/M (where M is a natural number) reference current of the normal data write current is supplied to reference voltage generation unit 70, whereby it is also possible to reduce power consumption.

Specifically, tuning unit TU# adjusts the current amount of the reference current on the basis of the number of transistors PTT, and multiplies the resistance value of resistance Rdl by L. Further, the transistor sizes of transistors 58 and 56 are set to be 1/L times as large as those of transistors 46 and Td. Accordingly, it is possible to generate desired reference voltage Vref2, to decrease the reference current supplied to reference voltage generation unit 70, and to decrease power consumption.

Fourth Embodiment

In the first to third embodiments, the configurations of supplying the desired data write current to the digit line or bit line have been described.

In a fourth embodiment, a configuration of suppressing a fluctuation in the impedance of the power supply wiring following the arrangement of the selected bit line will be described.

Figure 22:
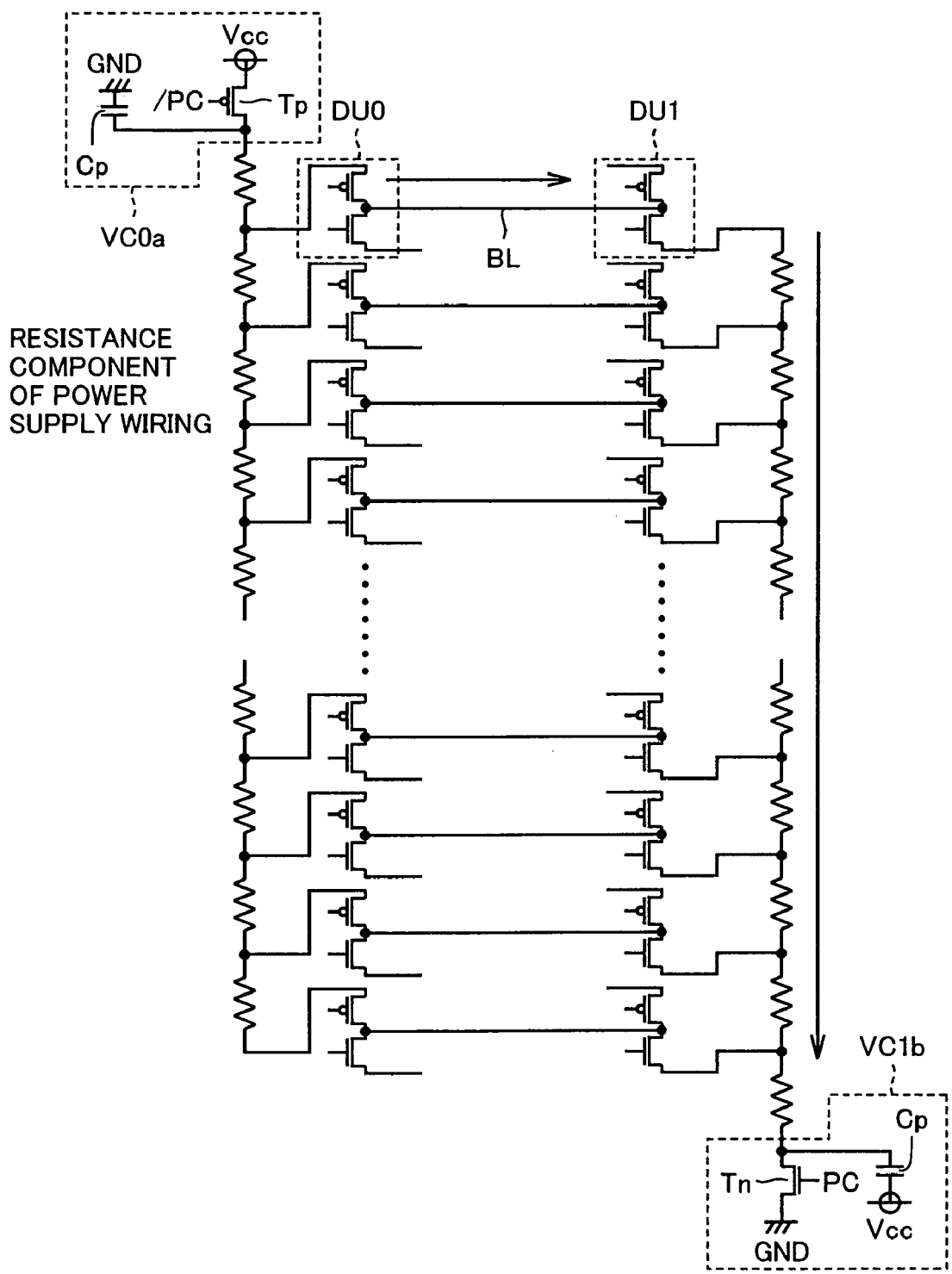
FIG. 22 is a conceptual diagram for describing the impedance of a power supply wiring in the case where a data write current is carried to a bit line.

With reference to FIG. 22, a fluctuation in the impedance of the power supply wiring following the arrangement of the selected bit line in the case where the data write current is carried to the bit line will be described.

Herein, in block unit BU, the data write current is supplied to bit line BL using current supply sections VC0a and VC1b.

Attention is paid to the power supply wiring connected to current supply section VC0a. The bit line arranged at the nearest point differs greatly in the resistance component of the power supply wiring, i.e., impedance from the bit line arranged at the farthest point. Accordingly, a fluctuation is generated between the data write current supplied to bit line BL arranged at the nearest point and the data write current supplied to bit line BL arranged at the farthest point. Following the fluctuation, there is a probability that a desired data write current cannot be supplied to bit line BL arranged at the farthest point, and that a data write operation at bit line BL at the farthest point is far slower than that at bit line BL at the nearest point.

With reference to FIG. 23A, a write driver band WDBB according to the fourth embodiment of the present invention has current supply sections provided on one end and the other end of the power supply wiring for supplying power supply voltage Vcc, respectively. In addition, write driver band WDBB has current supply sections provided on one end and the other end of the power supply wiring for supplying ground voltage GND, respectively.

Specifically, current supply section VC0a is provided on one end of the power supply wiring for supplying power supply voltage Vcc, and a current supply section VC0aa is provided on the other end thereof.

Current supply section VC0aa includes a transistor Tp# and a capacitor Cp#. Transistor Tp# and capacitor Cp# are similar to transistor Tp and capacitor Cp, respectively, and the connection and operation of the circuit are also similar to those of current supply section VC0a. Therefore, they will not be repeatedly described herein.

Further, the current supply sections are provided on one end and the other end of the power supply wiring for supplying ground voltage GND, respectively.

Specifically, current supply section VC0b is provided on one end of the power supply wiring for supplying ground voltage GND, and a current supply section VC0bb is provided on the other end thereof.

Current supply section VC0bb includes a transistor Tn# and a capacitor Cq#. Transistor Tn# and capacitor Cq# are similar to transistor Tn and capacitor Cq, respectively, and the connection and operation of the circuit are also similar to those of current supply section VC0b. Therefore, they will not be repeatedly described herein.

FIG. 23B shows a case where bit line BL close to current supply sections VC0a and VC0bb is selected. In this case, the voltage driving force of current supply section VC0a is stronger than that of current supply section VC0aa. In addition, the voltage driving force of current supply section VC0*bb* is stronger than that of current supply section VC0*b*.

FIG. 23C shows a case where bit line BL away from current supply sections VC0*a* and VC0*bb* is selected. In this case, the voltage driving force of current supply section VC0*aa* is stronger than that of current supply section VC0*a*. In addition, the voltage driving force of current supply section VC0*b* is stronger than that of current supply section VC0*bb*.

Consequently, the configuration of this embodiment can suppress the difference between bit line BL at the farthest point and the nearest point from the power supply wiring connected to bit line BL.

Accordingly, it is possible to suppress a fluctuation in the amount of the supplied data write current and to perform the high speed data write operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile memory device comprising:
   a memory array including a plurality of memory cells arranged in rows and columns each of which receives supply of a data write current in accordance with storing data for performing data storage,
   a plurality of bit lines provided corresponding to memory cell columns, respectively,
   a first power supply line provided in common corresponding to one end of said plurality of bit lines, electrically coupled to at least one bit line of said plurality of bit lines for supplying a first voltage during data writing,
   a second power supply line provided in common corresponding to the other end of said plurality of bit lines, electrically coupled to said at least one bit line of said plurality of bit lines for supplying a second voltage during said data writing,
   a plurality of first voltage supply sections provided corresponding to a plurality of sites, respectively, of said first power supply line for supplying said first voltage, and
   a plurality of second voltage supply sections provided corresponding to a plurality of sites, respectively, of said second power supply line for supplying said second voltage.

2. The non-volatile memory device according to claim 1, wherein said plurality of first voltage supply sections are provided respectively at both ends of said first power supply line, and said plurality of second voltage supply sections are provided respectively at both ends of said second power supply line.

* * * * *